(12) United States Patent
Seta et al.

(10) Patent No.: US 7,652,920 B2
(45) Date of Patent: Jan. 26, 2010

(54) SEMICONDUCTOR INTEGRATED CIRCUIT DEVICE

(75) Inventors: Shoji Seta, Tokyo (JP); Takeshi Yoshimoto, Hiratsuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 120 days.

(21) Appl. No.: 11/444,537

(22) Filed: Jun. 1, 2006

(65) Prior Publication Data

US 2006/0279984 A1 Dec. 14, 2006

(30) Foreign Application Priority Data

Jun. 2, 2005 (JP) ............................ 2005-162794
May 26, 2006 (JP) ............................ 2006-146508

(51) Int. Cl.
*G11C 16/06* (2006.01)
(52) U.S. Cl. ............................ 365/185.09; 365/185.33; 365/200
(58) Field of Classification Search ............ 365/185.09, 365/185.33, 200, 230.02
See application file for complete search history.

(56) References Cited

U.S. PATENT DOCUMENTS

| | | | | |
|---|---|---|---|---|
| 5,493,239 A | * | 2/1996 | Zlotnick | 326/38 |
| 5,883,842 A | * | 3/1999 | Miyauchi | 365/200 |
| 6,104,211 A | * | 8/2000 | Alfke | 326/91 |
| 6,538,468 B1 | * | 3/2003 | Moore | 326/40 |
| 6,924,678 B2 | * | 8/2005 | Starr | 327/147 |
| 7,190,190 B1 | * | 3/2007 | Camarota et al. | 326/38 |
| 7,368,940 B1 | * | 5/2008 | Schultz | 326/38 |
| 2003/0142550 A1 | | 7/2003 | Kawahara et al. | |
| 2003/0156454 A1 | * | 8/2003 | Wei et al. | 365/185.17 |
| 2005/0040844 A1 | * | 2/2005 | Plants | 326/9 |
| 2005/0073899 A1 | * | 4/2005 | Gallivan et al. | 365/232 |

FOREIGN PATENT DOCUMENTS

JP 2003-218212 A 7/2003

\* cited by examiner

*Primary Examiner*—Vu A Le
*Assistant Examiner*—Han Yang
(74) *Attorney, Agent, or Firm*—Foley & Lardner LLP

(57) ABSTRACT

A programmable logic device unit, a non-volatile memory unit which stores data for programming the programmable logic device unit in a part of data storage area thereof and a control circuit which controls the non-volatile memory unit to allow the data stored in a part of the data storage area to be read at power-on time and supplied to the programmable logic device unit are integrally provided on a semiconductor chip. Based on the program data, the programmable logic device unit forms an interface for allowing the non-volatile memory unit to operate as at least one of a register, a flash memory, a random access memory, and a read-only memory.

5 Claims, 32 Drawing Sheets

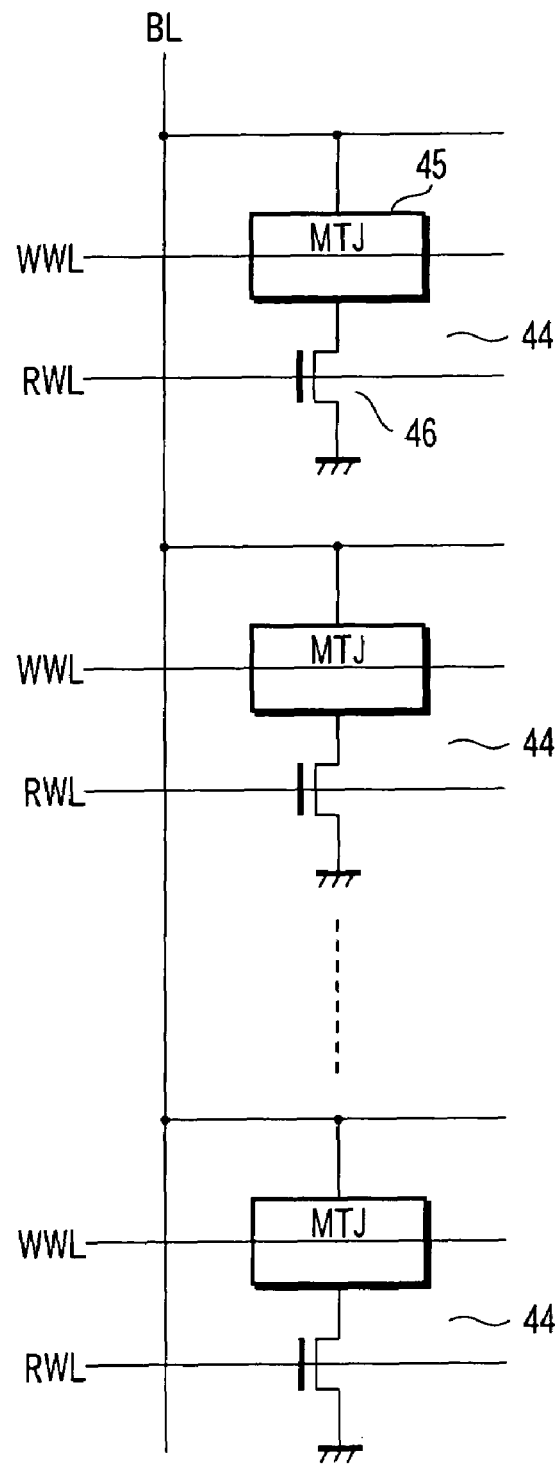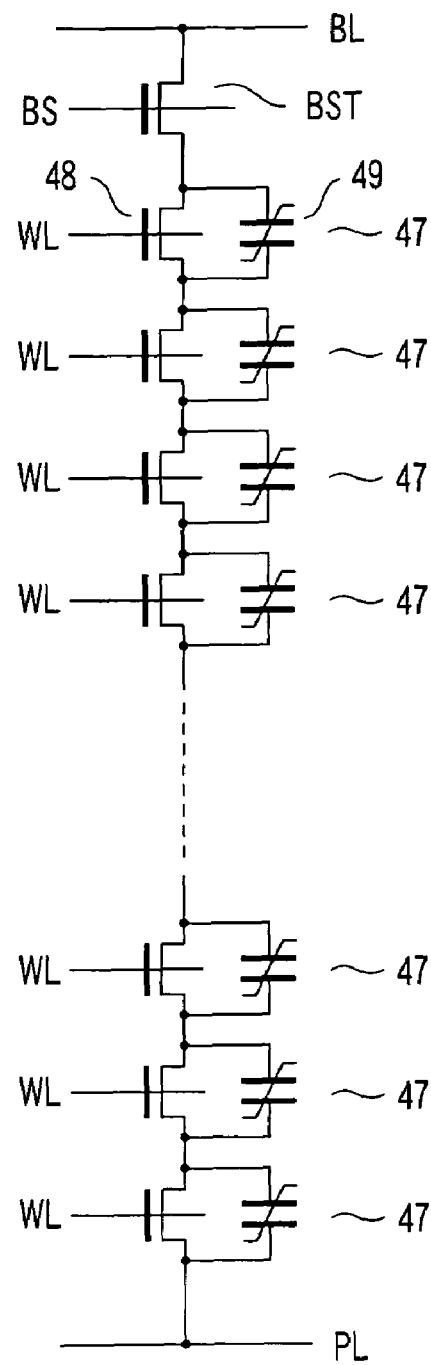
F I G. 16A  F I G. 16B

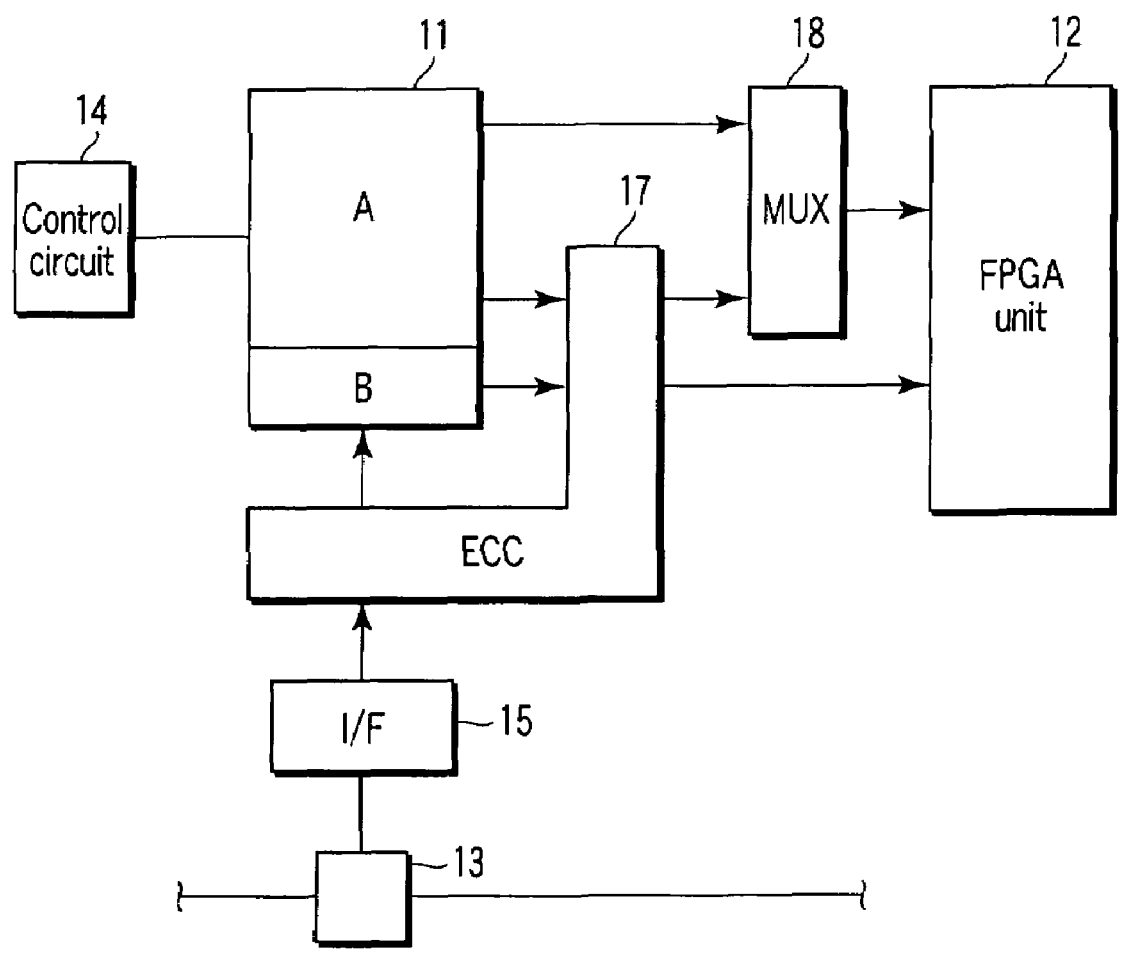
F I G. 20

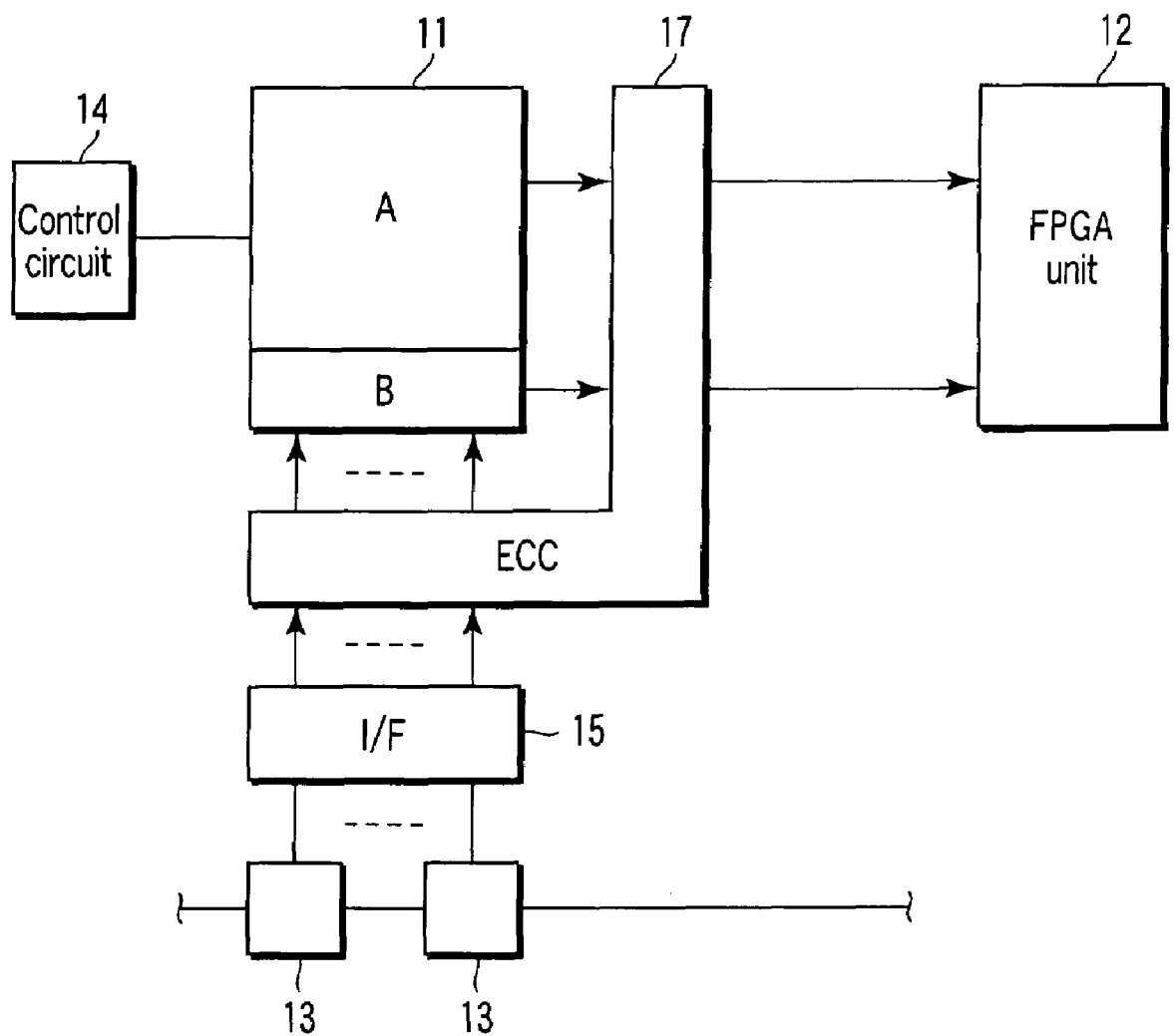
F I G. 25

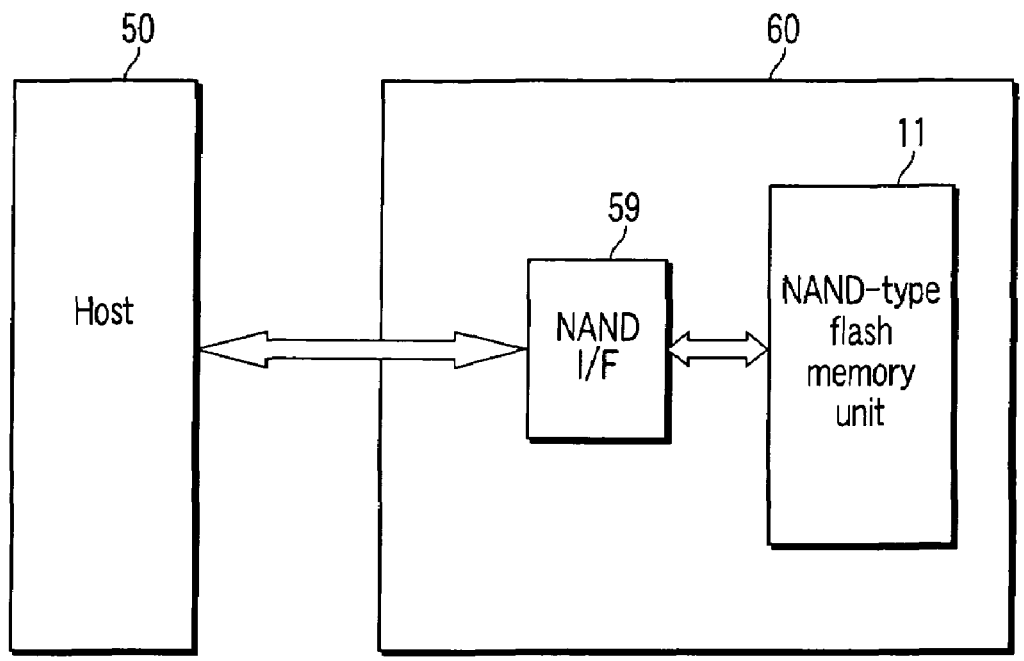
F I G. 26
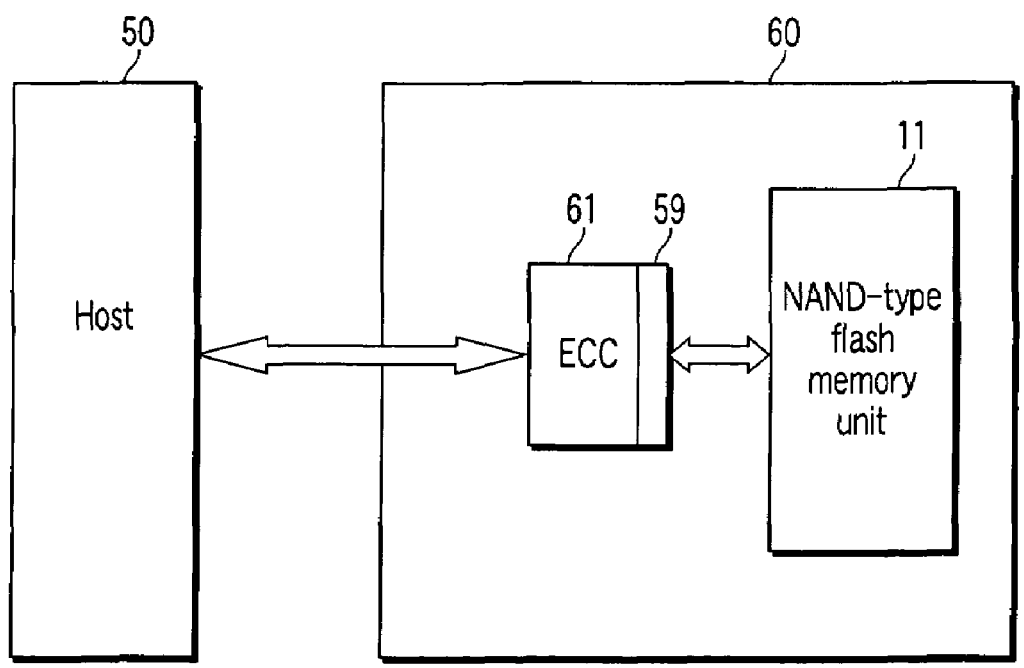
F I G. 27

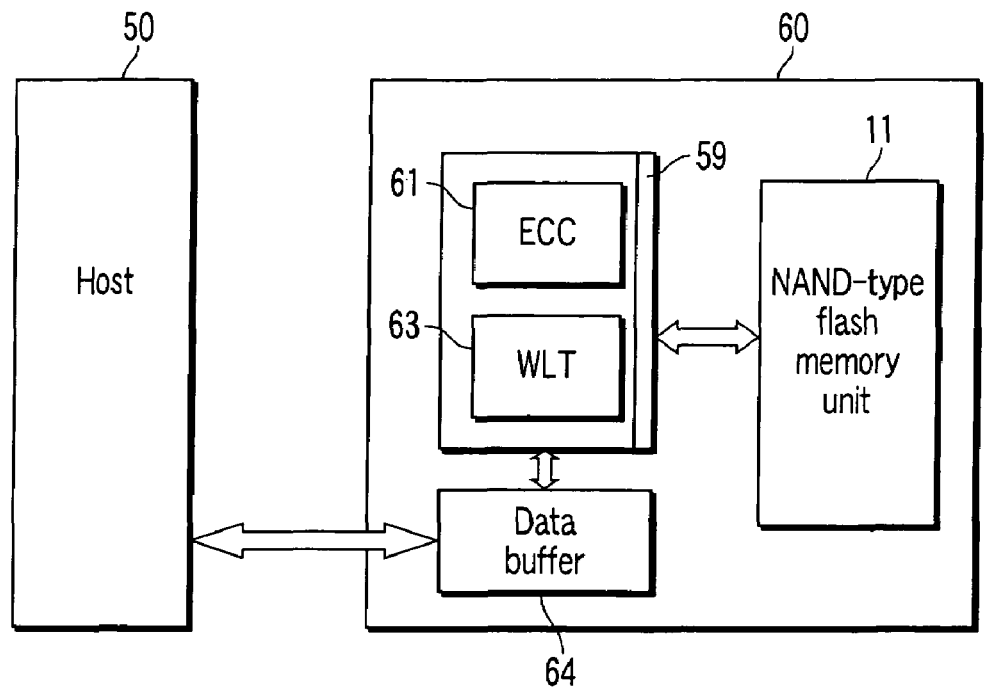
F I G. 34
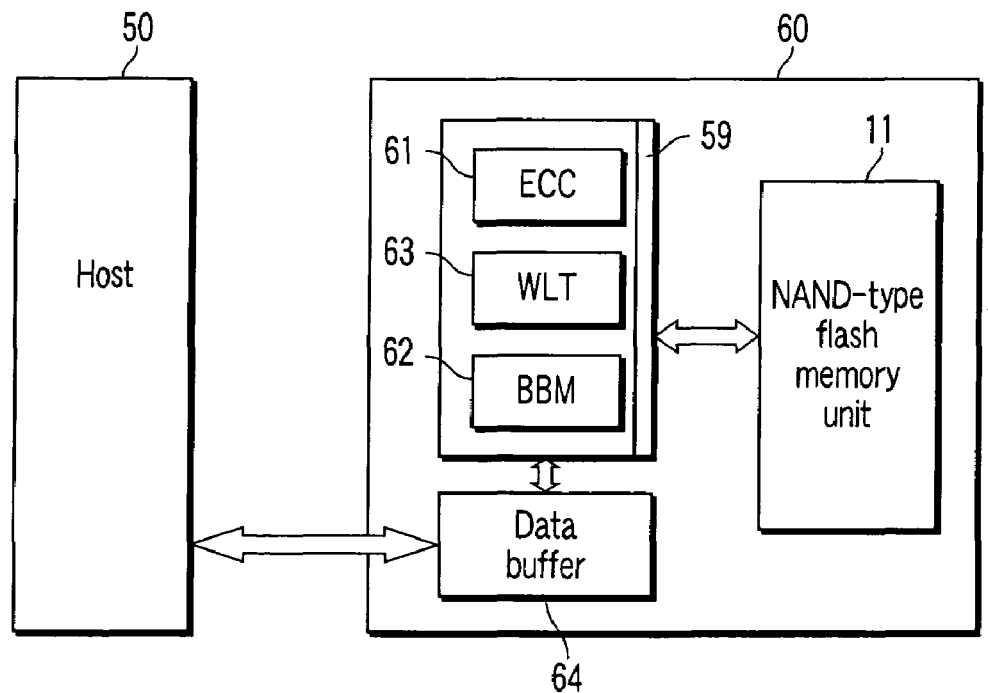
F I G. 35

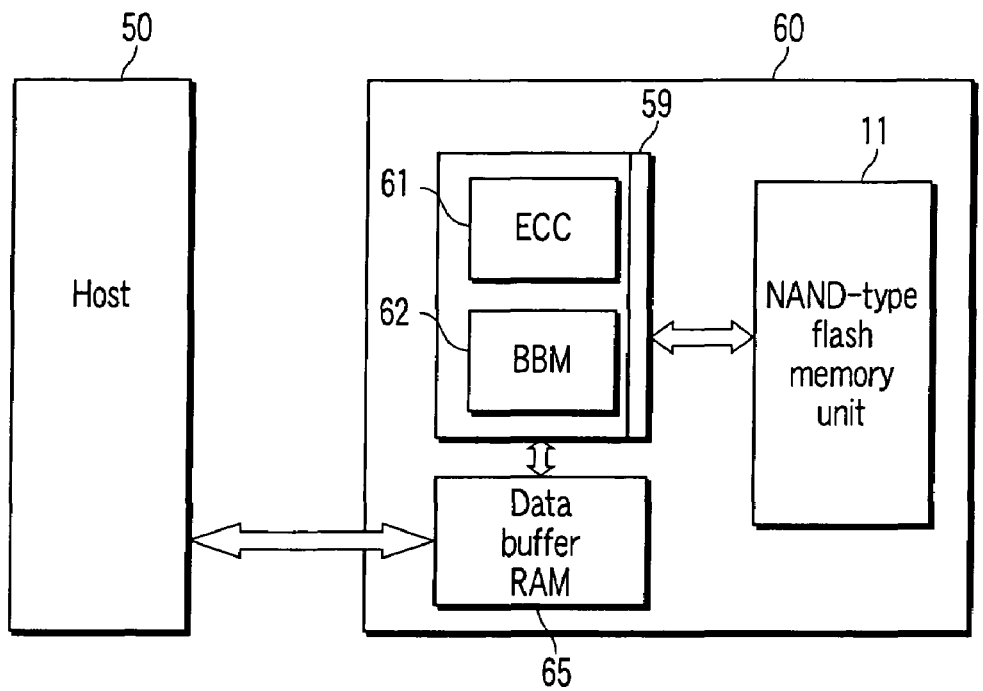
F I G. 38
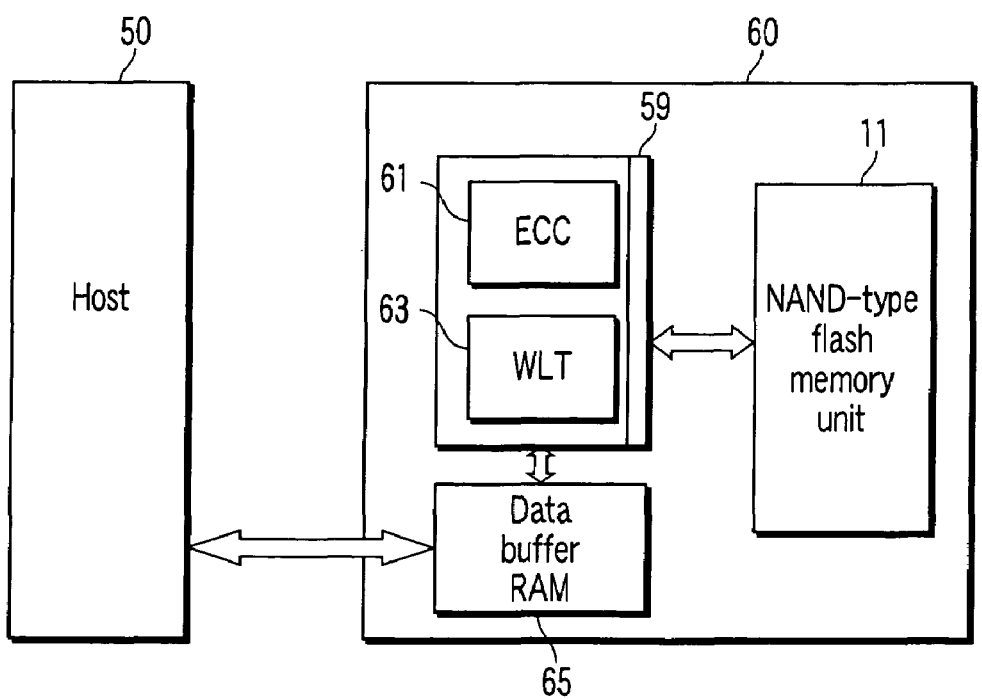
F I G. 39

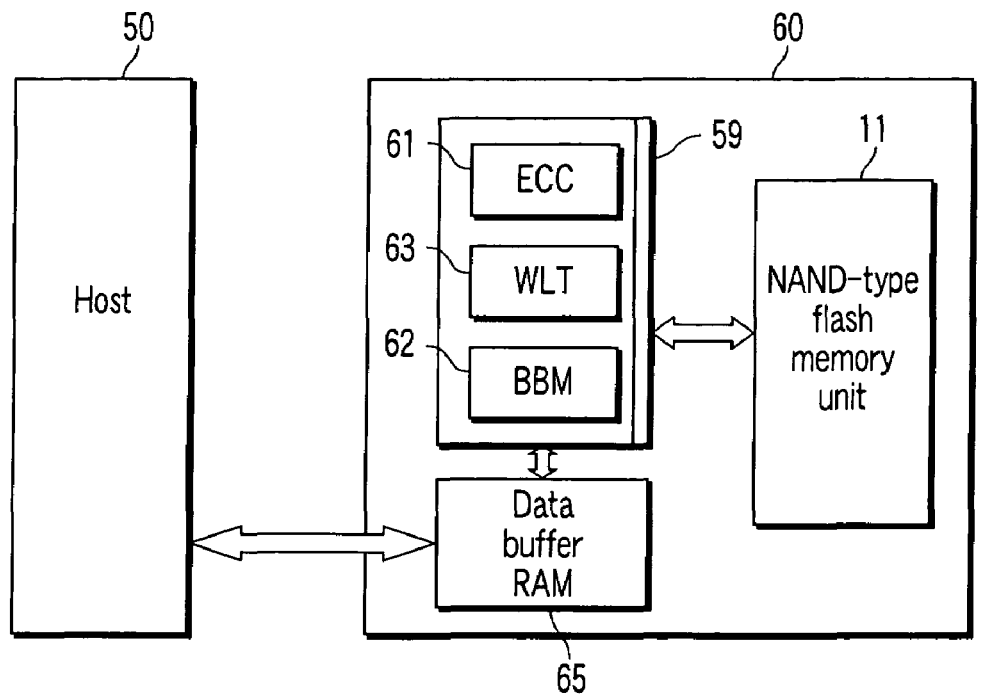
F I G. 40
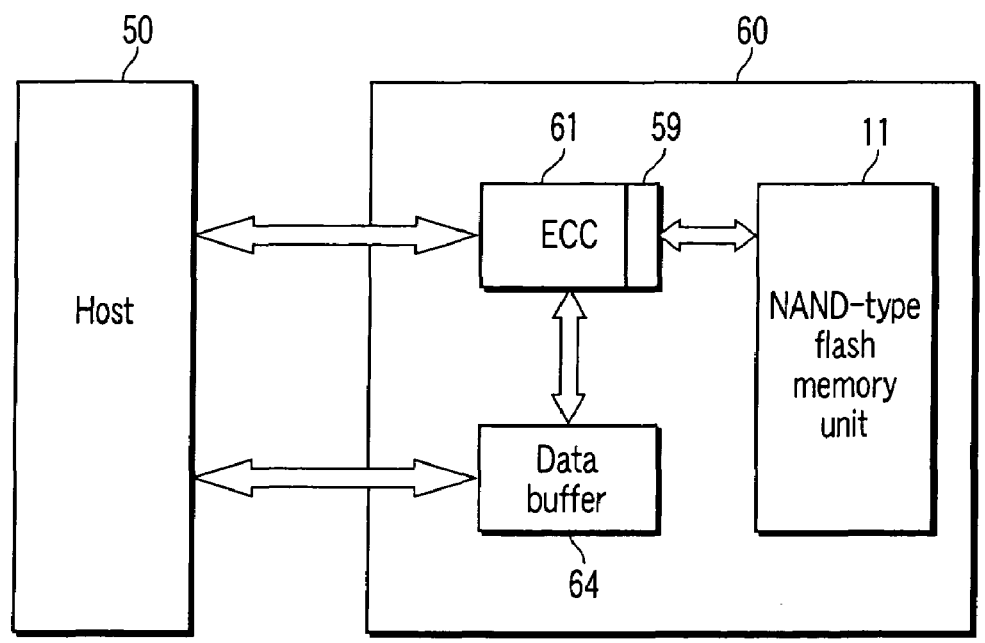
F I G. 41

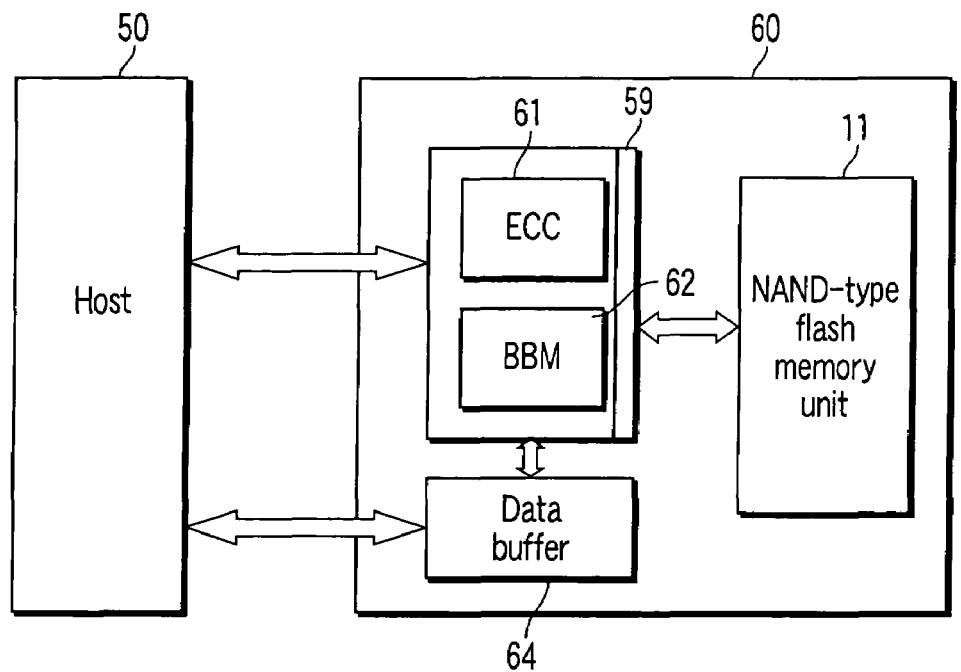
F I G. 42
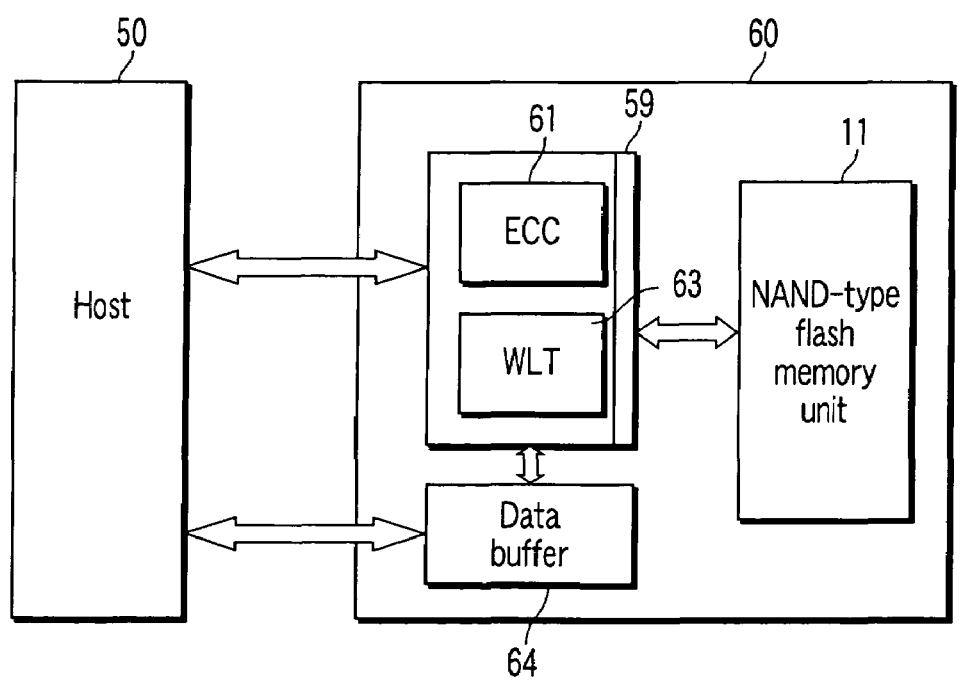
F I G. 43

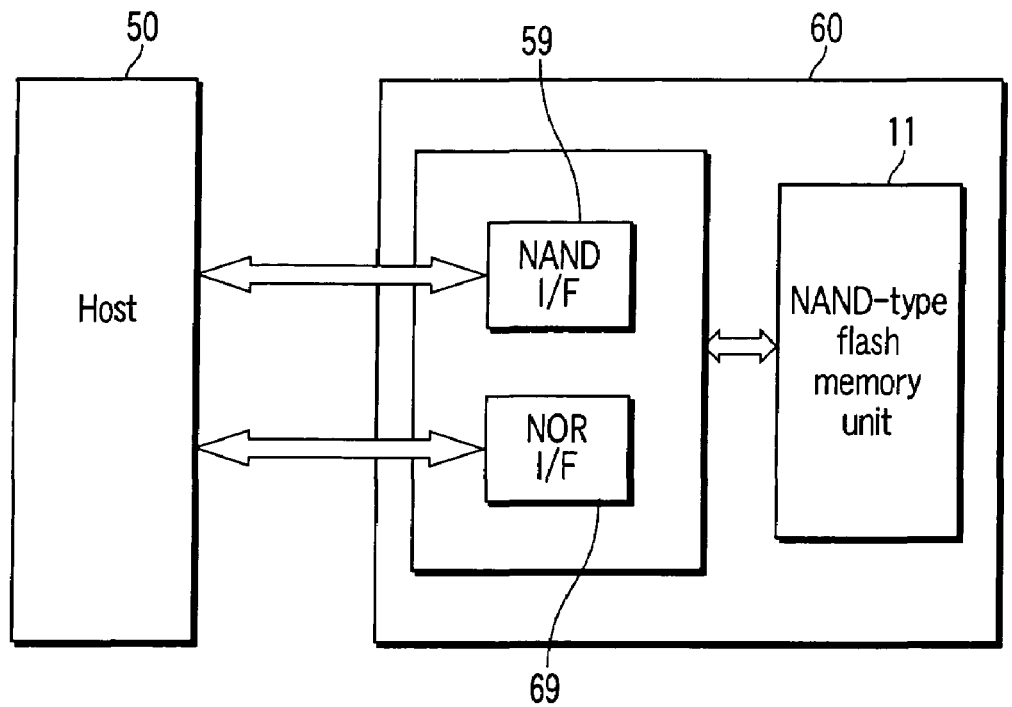
F I G. 50
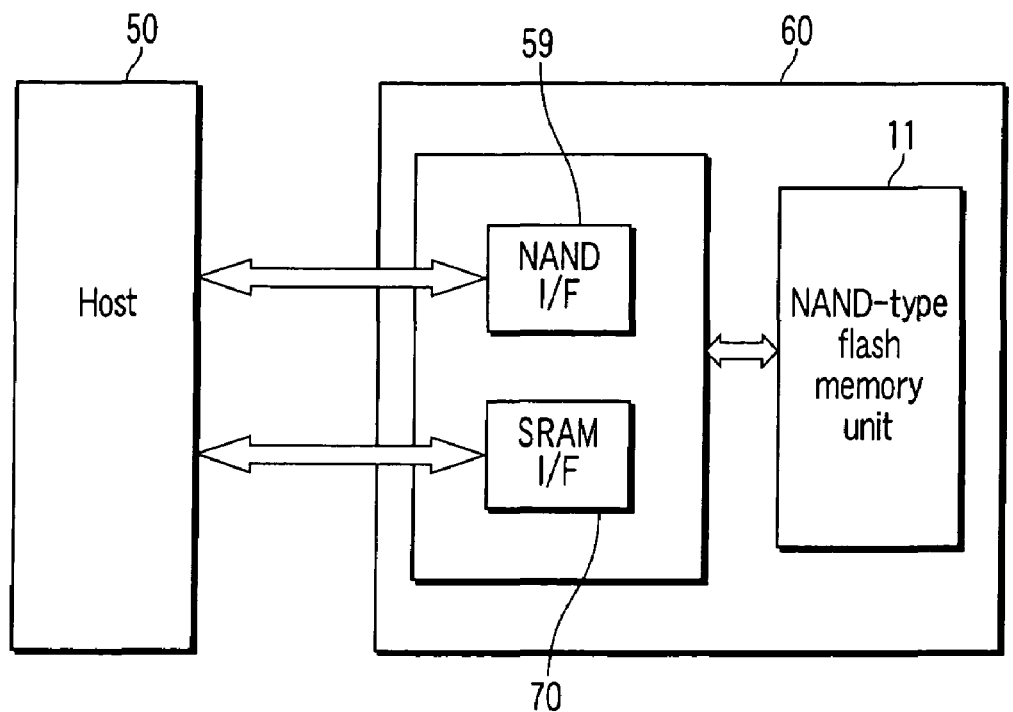
F I G. 51

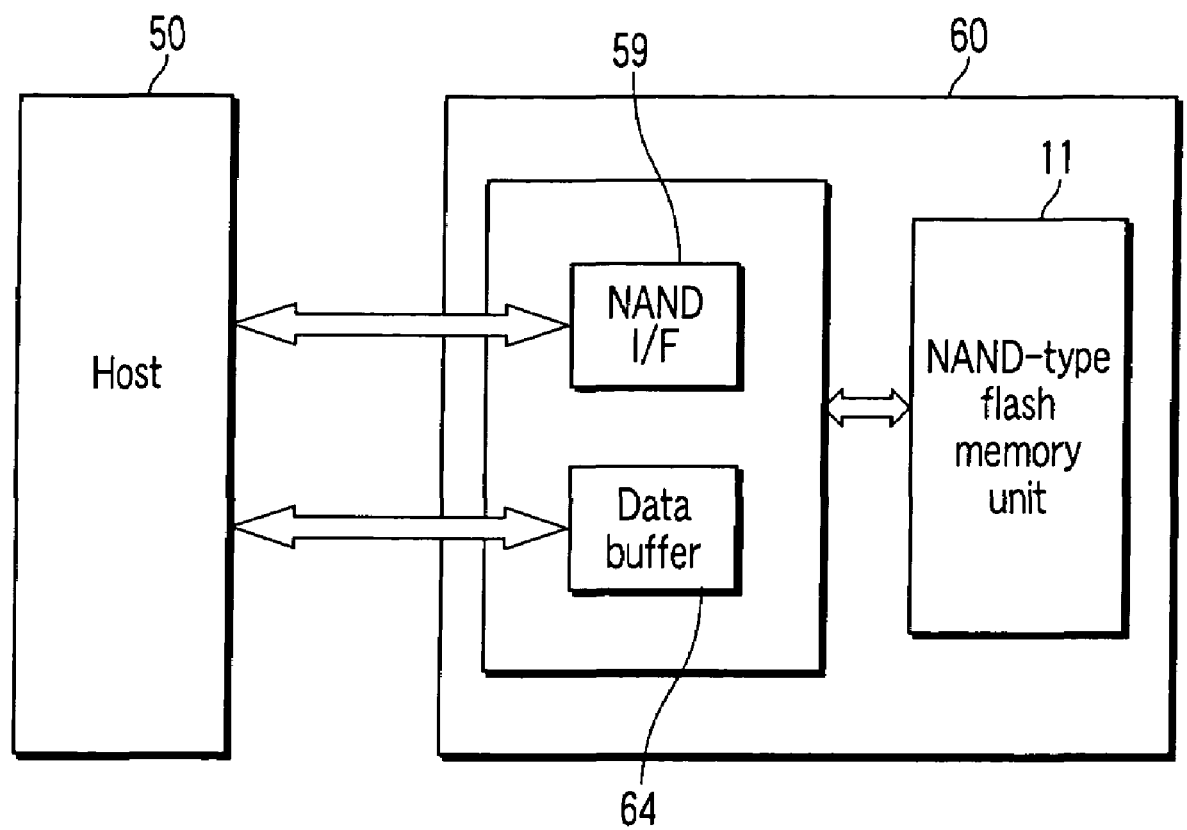
F I G. 52

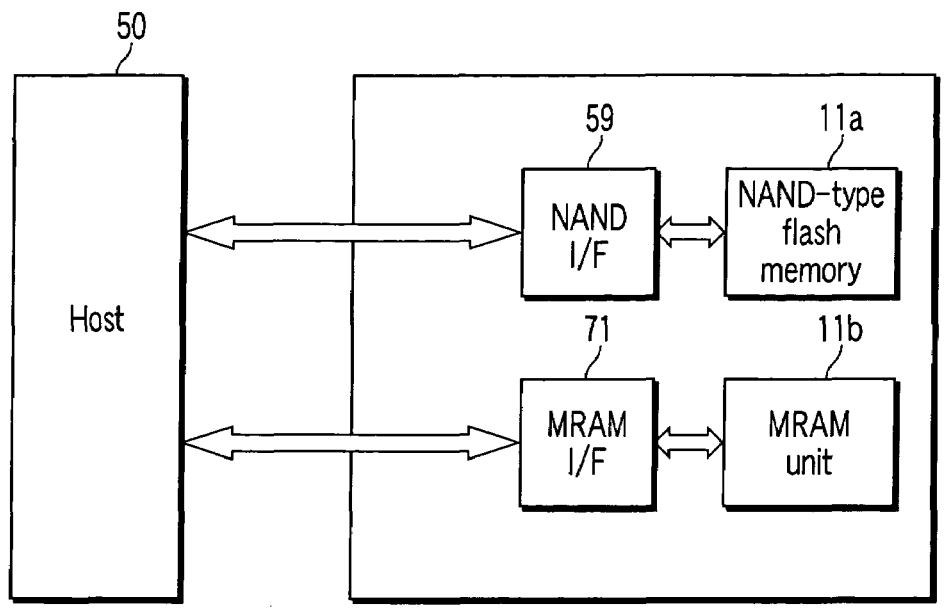
F I G. 55
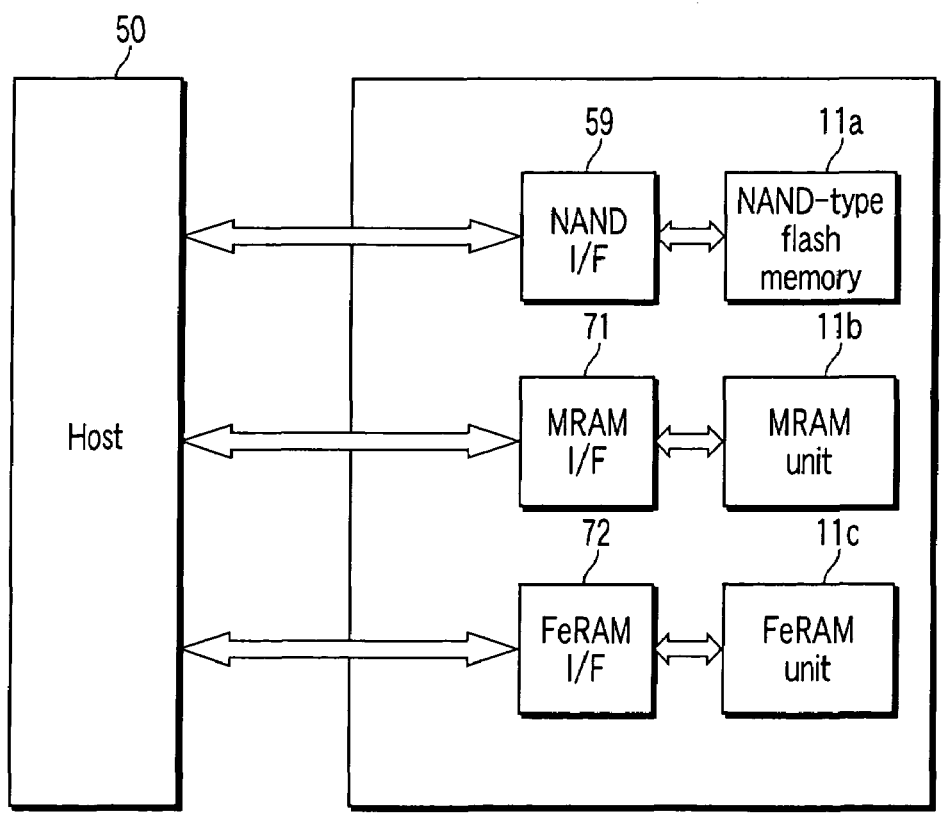
F I G. 56

SEMICONDUCTOR INTEGRATED CIRCUIT DEVICE

CROSS-REFERENCE TO RELATED APPLICATIONS

This application is based upon and claims the benefit of priority from the prior Japanese Patent Applications No. 2005-162794, filed Jun. 2, 2005; and No. 2006-146508, filed May 26, 2006, the entire contents of which are incorporated herein by reference.

BACKGROUND OF THE INVENTION

The present invention relates to a semiconductor integrated circuit device incorporating a non-volatile memory unit and a programmable logic device unit.

Businesses that manufacture semiconductor chips in which system LSIs are provided around non-volatile memories such as NAND-type flash memories are spreading. However, the specification of a system LSI differs from one client to another, and the interface changes depending on the specification. Accordingly, a mask must be made for each product in its manufacturing process, increasing development cost and reducing versatility.

A technique that provides a flash memory unit on one semiconductor chip integrally with an FPGA unit, a CPU, a RAM, and the like and stores data for programming the FPGA unit in a SRAM static latch, an anti-fuse, a non-volatile memory cell, or the like is disclosed in Jpn. Pat. Appln. Publication No. 2003-218212.

BRIEF SUMMARY OF THE INVENTION

According to an aspect of the present invention, there is realised a semiconductor integrated circuit device comprising: a programmable logic device unit provided on a semiconductor chip; a non-volatile memory unit which is provided on the semiconductor chip and stores data for programming the programmable logic device unit in a part of data storage area thereof; and a control circuit which controls the non-volatile memory unit to allow the data stored in the part of the data storage area to be read at power-on time and supplied to the programmable logic device unit.

BRIEF DESCRIPTION OF THE SEVERAL VIEWS OF THE DRAWING

FIGS. 16A and 16B are circuit diagrams each showing a part of another configuration of the memory cell array in the flash memory unit shown in FIG. 1;

FIG. 20 is a view showing a circuit configuration example in the case where the program data is written to the data storage area of the flash memory unit shown in FIG. 18;

FIG. 25 is a view showing another circuit configuration example in the case where the program data is written to the data storage area of the flash memory unit shown in FIG. 22;

FIG. 26 is a block diagram showing a concrete example of a circuit realized by using the FPGA unit shown in FIG. 1, FIG. 8, or FIG. 22;

FIG. 27 is a block diagram showing a concrete example of a circuit realized by using the FPGA unit shown in FIG. 1, FIG. 8, or FIG. 22;

FIG. 34 is a block diagram showing a concrete example of a circuit realized by using the FPGA unit shown in FIG. 1, FIG. 8, or FIG. 22;

FIG. 35 is a block diagram showing a concrete example of a circuit realized by using the FPGA unit shown in FIG. 1, FIG. 8, or FIG. 22;

FIG. 38 is a block diagram showing a concrete example of a circuit realized by using the FPGA unit shown in FIG. 1, FIG. 8, or FIG. 22;

FIG. 39 is a block diagram showing a concrete example of a circuit realized by using the FPGA unit shown in FIG. 1, FIG. 8, or FIG. 22;

FIG. 40 is a block diagram showing a concrete example of a circuit realized by using the FPGA unit shown in FIG. 1, FIG. 8, or FIG. 22;

FIG. 41 is a block diagram showing a concrete example of a circuit realized by using the FPGA unit shown in FIG. 1, FIG. 8, or FIG. 22;

FIG. 42 is a block diagram showing a concrete example of a circuit realized by using the FPGA unit shown in FIG. 1, FIG. 8, or FIG. 22;

FIG. 43 is a block diagram showing a concrete example of a circuit realized by using the FPGA unit shown in FIG. 1, FIG. 8, or FIG. 22;

FIG. 50 is a block diagram showing a concrete example of a circuit realized by using the FPGA unit shown in FIG. 1, FIG. 8, or FIG. 22;

FIG. 51 is a block diagram showing a concrete example of a circuit realized by using the FPGA unit shown in FIG. 1, FIG. 8, or FIG. 22;

FIG. 52 is a block diagram showing a concrete example of a circuit realized by using the FPGA unit shown in FIG. 1, FIG. 8, or FIG. 22;

FIG. 55 is a block diagram showing a concrete example of a circuit realized by using the FPGA unit shown in FIG. 1, FIG. 8, or FIG. 22; and FIG. 56 is a block diagram showing a concrete example of a circuit realized by using the FPGA unit shown in FIG. 1, FIG. 8, or FIG. 22.

DETAILED DESCRIPTION OF THE INVENTION

The present invention will now be described in further detail using embodiments with reference to the accompanying drawings.

Figure 1:
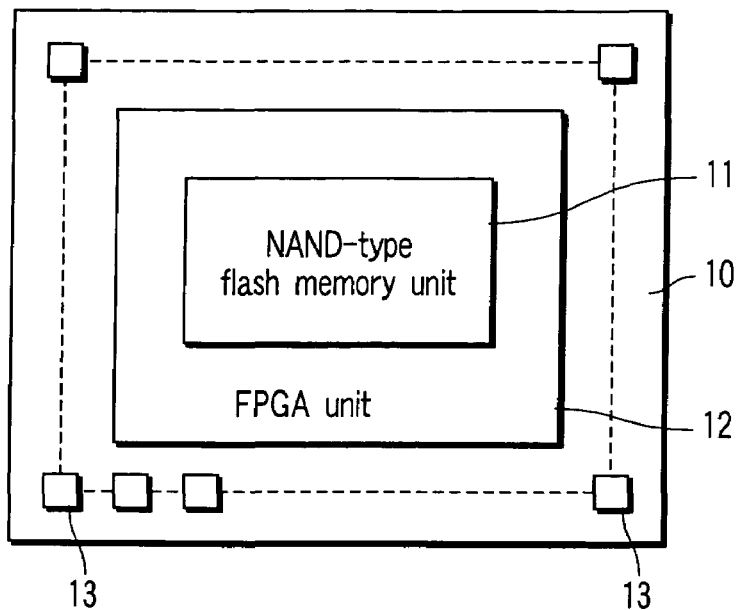
FIG. 1 is a plan view of a semiconductor chip in a semiconductor integrated circuit device according to a first embodiment of the present invention.

FIG. 1 is a plan view of a semiconductor chip in a semiconductor integrated circuit device according to a first embodiment of the present invention. A non-volatile memory unit 11 including a memory cell array with a plurality of non-volatile programmable devices and peripheral circuitry and a programmable logic device unit 12 are integrally mounted on the semiconductor chip 10.

A plurality of external terminals 13 are formed around the semiconductor device 10. The external terminals 13 exchange various types of data with an external device and receive source voltage to be supplied to the semiconductor chip 10.

Further, a control circuit (not shown) for controlling the non-volatile memory unit 11 is formed on the semiconductor chip 10. The control circuit allows data stored in a part of the data storage area of the non-volatile memory unit 11 to be read at power-on time and supplied to the programmable logic device unit 12.

In the semiconductor integrated circuit device according to the first embodiment, a NAND-type flash memory unit 11 is formed as an example of the non-volatile memory unit 11, and a field programmable gate array (FPGA) unit having an FPGA structure is formed as the programmable logic device unit 12. However, as the non-volatile memory unit 11, not only the NAND-type flash memory unit but also one of a NOR-type or AND-type flash memory unit, an MRAM unit having an MRAM cell, and an FeRAM unit having an FeRAM cell may be formed; and, as the programmable logic device unit 12, not only the FPGA unit but also a complex programmable logic device (CPLD) unit having a CPLD structure, a D Fabric Array (DFA) (TM), and other units having a PLD structure may be formed.

In the semiconductor integrated circuit device according to the first embodiment, the FPGA unit 12 is so formed as to surround the flash memory unit 11.

Figure 2:
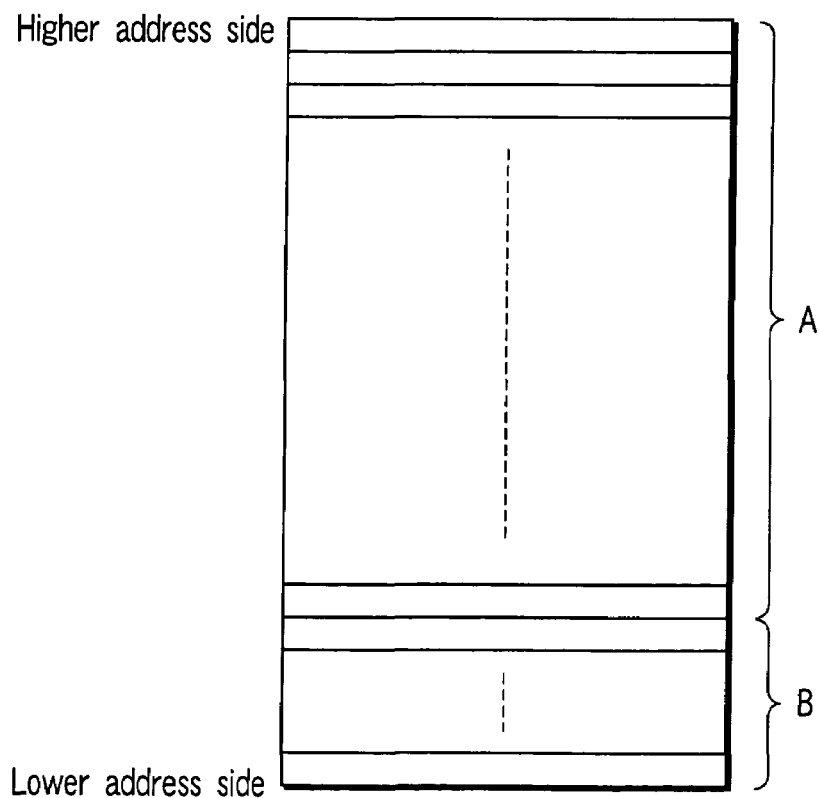
FIG. 2 is a view showing an address space of a flash memory unit shown in FIG. 1.

FIG. 2 shows an address space of the flash memory unit 11 shown in FIG. 1. Two data storage areas A and B are set in the flash memory unit 11. The data storage area A on the higher address side of the address space stores ordinary data. The data storage area B on the lower address side stores data (program) for programming the FPGA unit 12.

Figure 3:
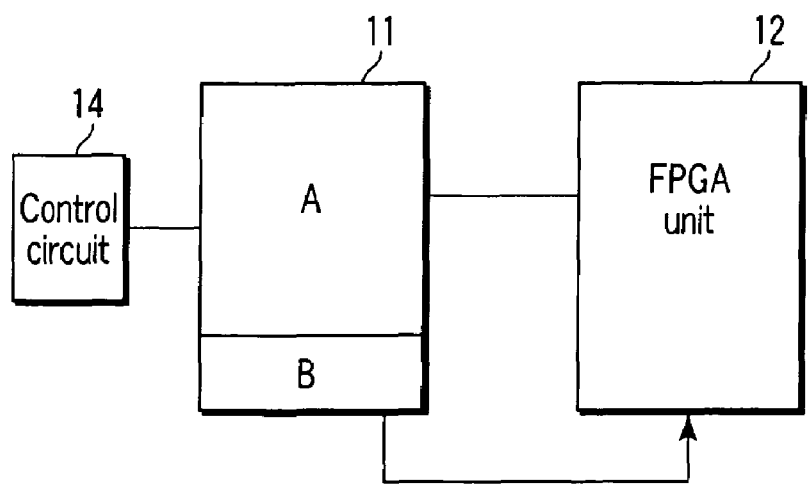
FIG. 3 is a circuit diagram showing a circuit configuration example in the case where data is read from the data storage area of the flash memory unit shown in FIG. 1.

In the semiconductor integrated circuit device having the configuration described above, program data for programming the FPGA unit 12 is previously stored in the data storage area B of the flash memory unit 11. A data read operation from the data storage area B is performed as follows. For example, as shown in FIG. 3, a control circuit 14 controls operation of the flash memory unit 11 at power-on time to allow the program data stored in the data storage area B to be read from the flash memory unit 11 and supplied to the FPGA unit 12. The FPGA unit 12 performs operation called "Configuration" to form a circuit having a function corresponding to the program data. The circuit realized by using the FPGA unit 12 includes various interface circuits of the flash memory unit 11, various types of control circuits, a clock generator, an arithmetic circuit, and the like.

In general, an SRAM is used as a means for storing program data in the FPGA. The SRAM is constituted by a volatile programmable device, so that data stored in the SRAM is lost when power is tuned off and, accordingly, the program data needs to be supplied to the FPGA every time power is turned on for reformation of the circuit corresponding to the program data.

On the other hand, in the semiconductor integrated circuit device according to the first embodiment, the data for programming the FPGA unit 12 is stored in the flash memory unit 11, so that the data is retained therein even when power is turned off and, when power is turned on, the program data stored in the data storage area B of the flash memory unit 11 is read out and then supplied to the FPGA unit 12. That is, a circuit having the same function as before can be implemented by using the FPGA unit 12 every time power is turned on.

Further, simply by changing the program data to be stored in the data storage area B of the flash memory unit 11, it is possible to allow the FPGA unit 12 to easily implement circuits having various functions after manufacturing of a semiconductor chip. As a result, a semiconductor integrated circuit device having high versatility can be realized. Further, since there is no need to make a mask for each product as in the case of the conventional technique, development cost can be reduced.

The programmable device provided in the flash memory unit 11 is non-volatile type and a data writable one. Next, an example of a circuit configuration in the case where the program data is written to the flash memory unit 11 will be described.

Figure 4:
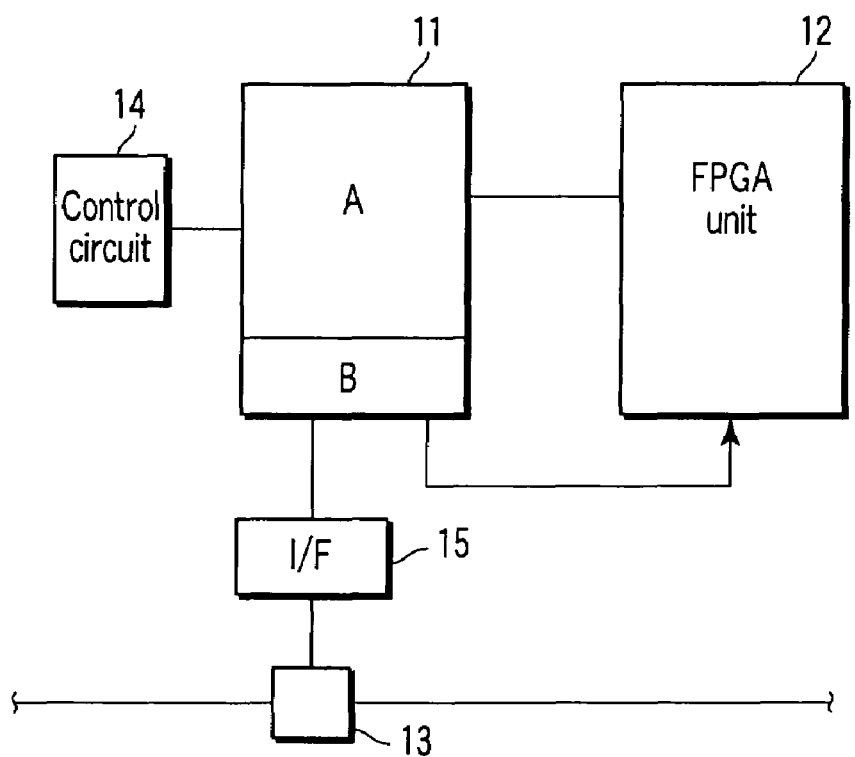
FIG. 4 shows a circuit configuration example in the case where the program data is written to the data storage area of the flash memory unit shown in FIG. 1.

FIG. 4 shows a circuit configuration example in the case where the program data is written to the data storage area B of the flash memory unit 11.

In this example, one external terminal 13 provided in the semiconductor chip is used. The program data is input serially to the external terminal 13 and then supplied to the flash memory unit 11 through an interface 15 provided in the flash memory unit 11. The program data thus supplied is sequentially written to the data storage area B.

Figure 5:
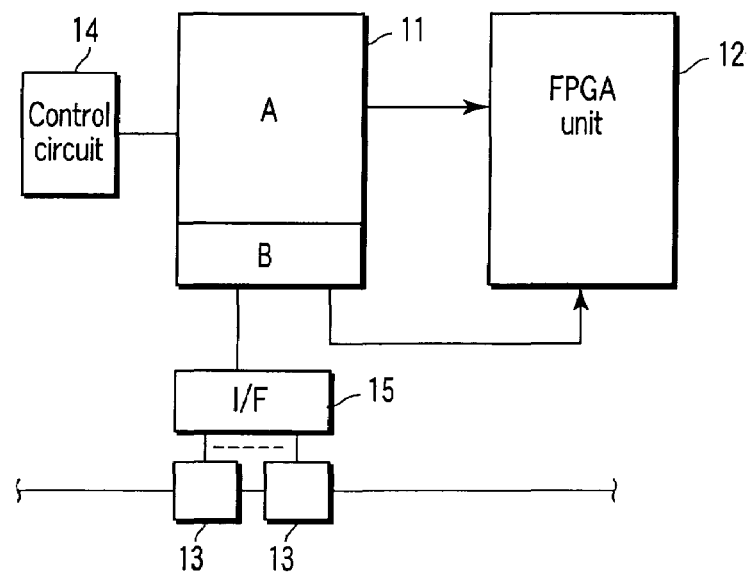
FIG. 5 shows another circuit configuration example in the case where the program data is written to the data storage area of the flash memory unit shown in FIG. 1.

FIG. 5 shows another circuit configuration example in the case where the program data is written to the data storage area B of the flash memory unit 11.

In this example, a plurality of external terminals 13 provided in the semiconductor chip are used. The program data is input in parallel to the external terminals 13 and then supplied to the flash memory unit 11 through the interface 15 provided in the flash memory unit 11. The program data thus supplied is then written to the data storage area B. Either a parallel or serial data path may be used between the interface 15 and flash memory unit 11. The location of the data storage area B may be set depending on the type of data supplied from the external terminal.

Figures 6A, 6B:
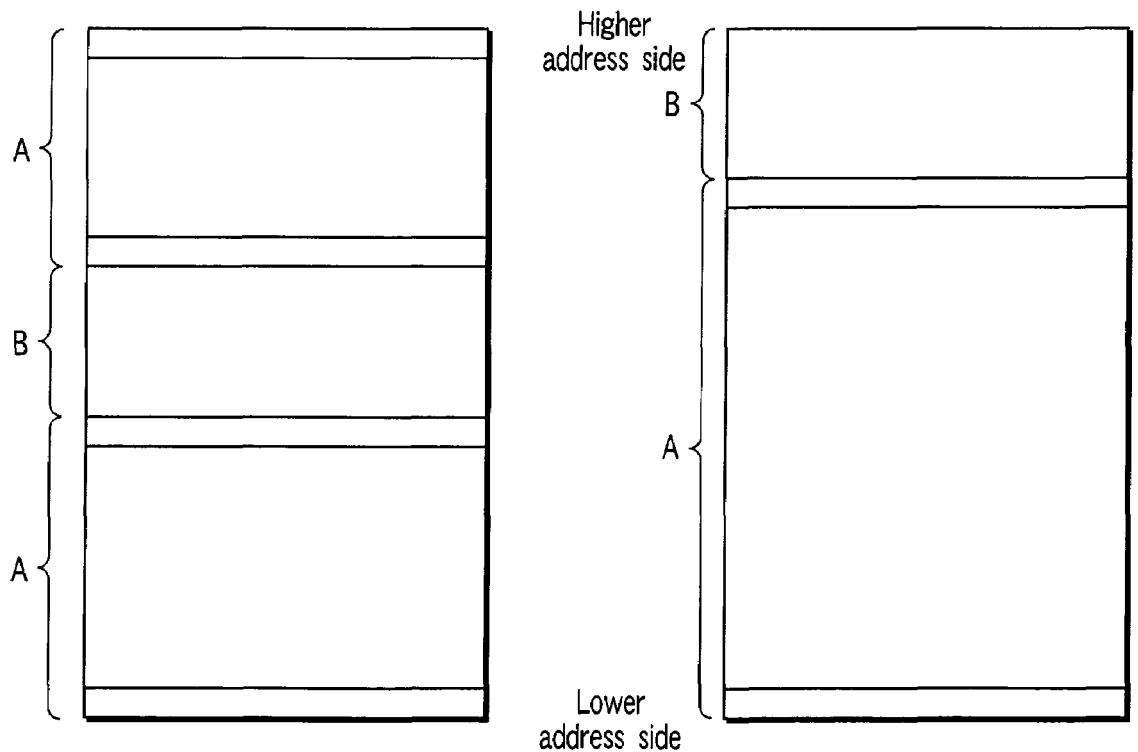
FIGS. 6A and 6B are views each showing another example of the address space of the flash memory unit shown in FIG. 1.

The location of the data storage area B in which the program data for programming the FPGA unit 12 is stored is not limited to that as shown in FIG. 2, i.e., the lower address side of the address space of the flash memory unit 11. The data storage area B may be set in the intermediate address portion of the address apace as shown in FIG. 6A and, further, it may be set in the higher address side of the address space as shown in FIG. 6B.

The size of the data storage area B of the flash memory unit 11 may be set to a fixed value depending on the specification. When the size of the data storage area B is set to a fixed value based on the maximum value of the circuit scale that can be realized using the FPGA unit 12, shortage of the data storage area can be prevented. This method may be used in many cases.

The data amount to be stored in the flash memory unit 11 increases/decreases depending on the scale of a circuit that can be realized using the FPGA unit 12. If the size of the data storage area B is set to a large value in spite of smaller program data amount, an unnecessary area in which the data is not stored is caused in the data storage area B. Thus, in order to make best use of the data storage area of the flash memory unit 11, the size of the data storage area B may be configured to be changeable.

Next, a circuit configuration for changing the size of the data storage area B of the flash memory unit 11 will be described.

Figure 7:
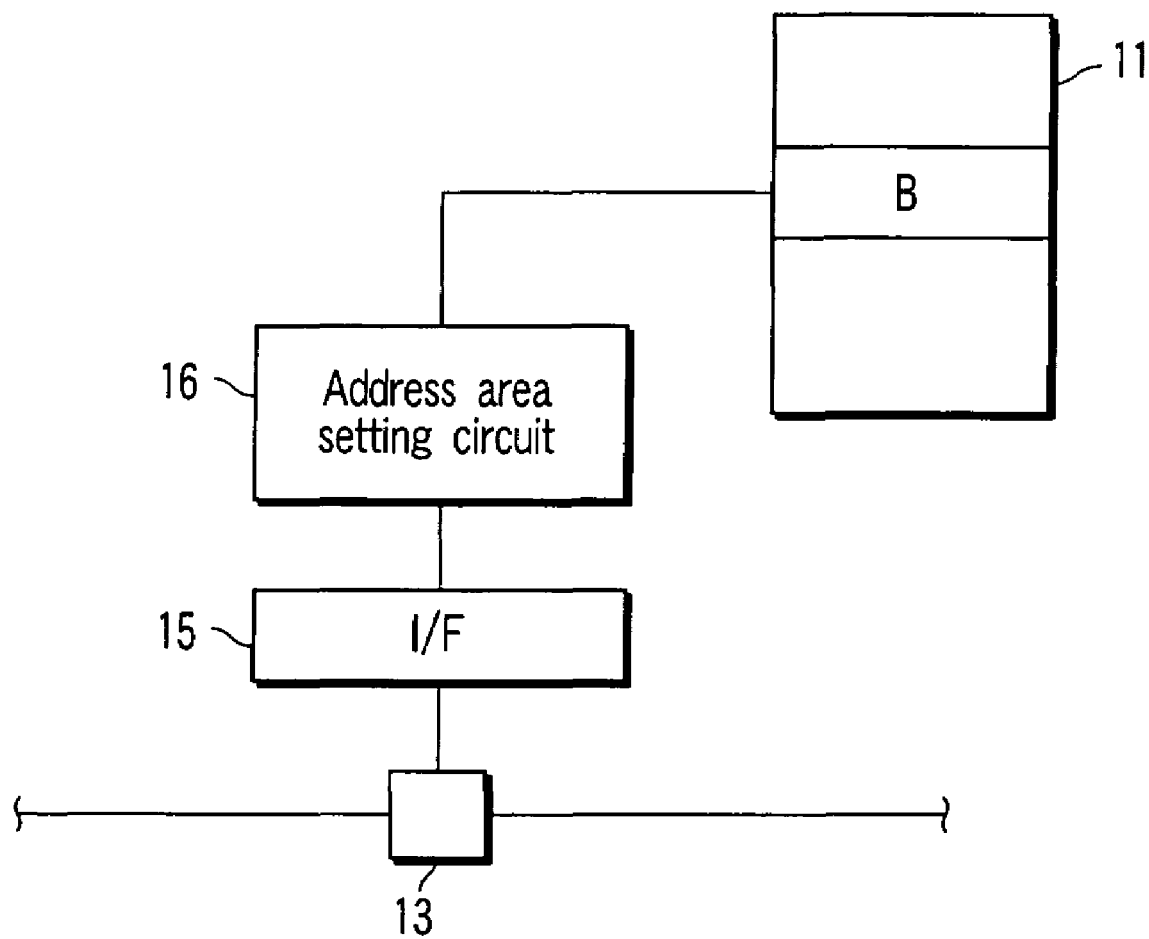
FIG. 7 is a view showing a circuit configuration example for changing the size of the data storage area of the flash memory unit shown in FIG. 1.

FIG. 7 shows a circuit configuration example for changing the size of the data storage area B of the flash memory unit 11.

In this example, one external terminal 13 provided on the semiconductor chip is used. Data for setting the size of the data storage area B is input to the external terminal 13 and then supplied to an address area setting circuit 16 through an interface 15. The address area setting circuit 16 then sets the size of the data storage area B in the flash memory unit 11 based on the data for size setting. Either parallel or serial data path may be used between the interface 15 and flash memory unit 11.

In this case, a plurality of external terminals 13 provided on the semiconductor chip may be used. The data for setting the size of the data storage area B is input serially to the external terminals 13 and then supplied to the address area setting circuit 16 through an interface 15.

In a circuit shown in FIG. 7, the address of the data storage area B whose size has been changed by the address area setting circuit 16 is stored in the abovementioned control circuit 14. At data read time from the data storage area B, the data stored in this address is read and then supplied to the FPGA unit 12.

The size of the data storage area B can be set variously depending on the use.

Figures 8A, 8B, 8C:
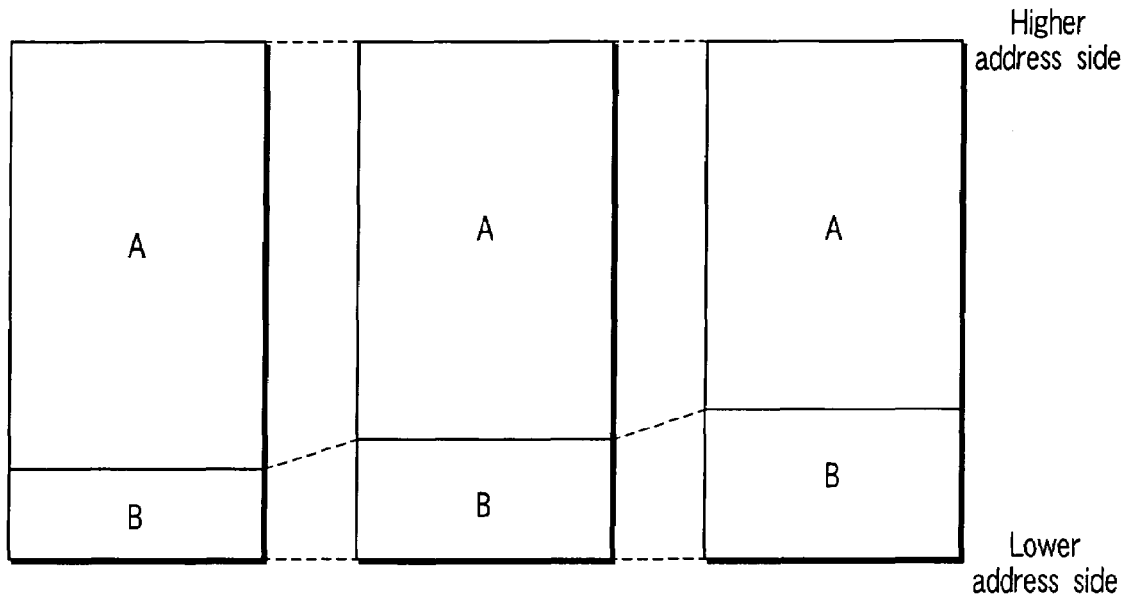
FIGS. 8A to 8C are views showing an example in the case where the size of the data storage area of the flash memory unit shown in FIG. 1 is changed.

FIGS. 8A to 8C show a case where the size of the data storage area B is changed by changing the higher address side of the data storage area B while fixing the lowermost address of the data storage area B to the lowermost address of the address space.

Figures 9A, 9B, 9C:
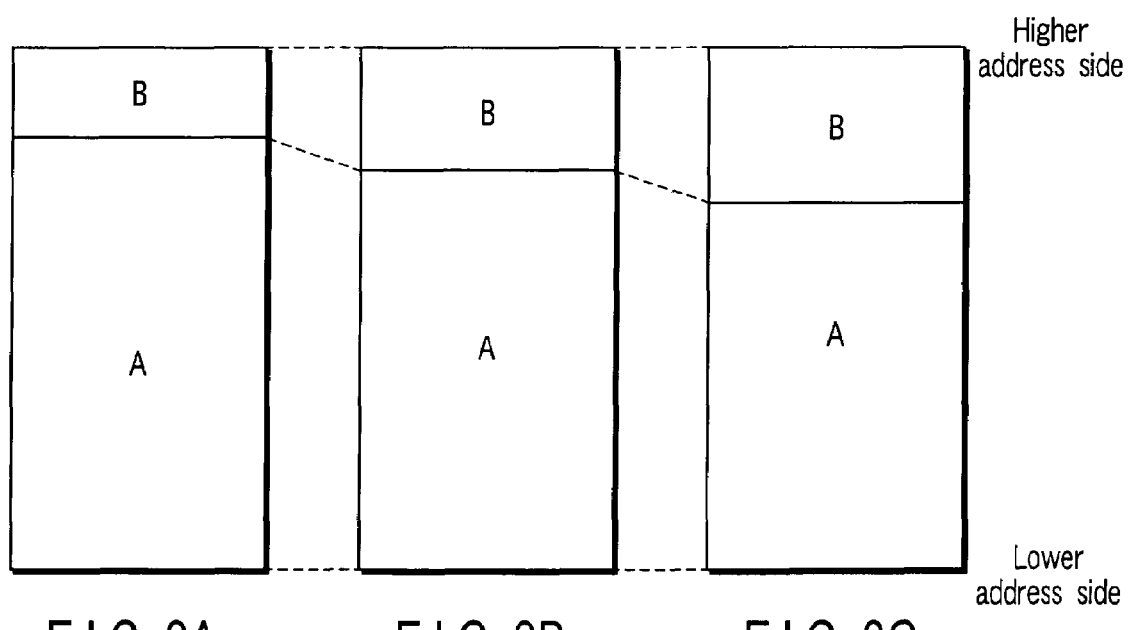
FIGS. 9A to 9C are views showing another example in the case where the size of the data storage area of the flash memory unit shown in FIG. 1 is changed.

FIGS. 9A to 9C show a case where the size of the data storage area B is changed by changing the lower address side of the data storage area B while fixing the highest address of the data storage area B to the highest address of the address space.

Figures 10A, 10B, 10C:
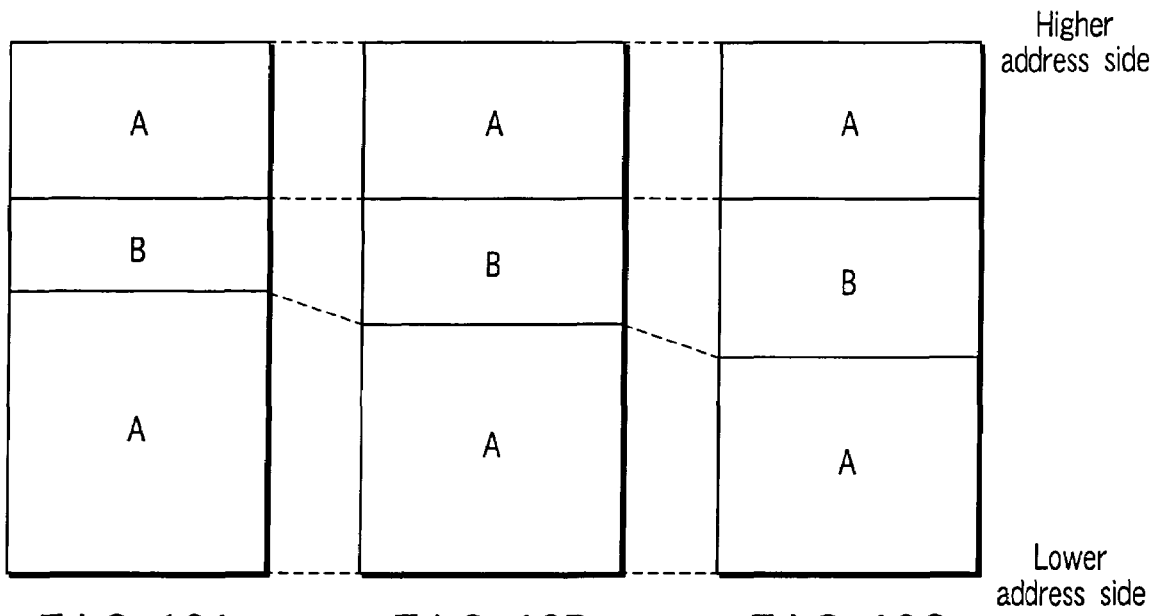
FIGS. 10A to 10C are views showing another example in the case where the size of the data storage area of the flash memory unit shown in FIG. 1 is changed.

FIGS. 10A to 10C show a case where the size of the data storage area B is changed by changing the lower address side of the data storage area B while fixing the highest address of the data storage area B to a given intermediate address of the address space.

Figures 11A, 11B, 11C:
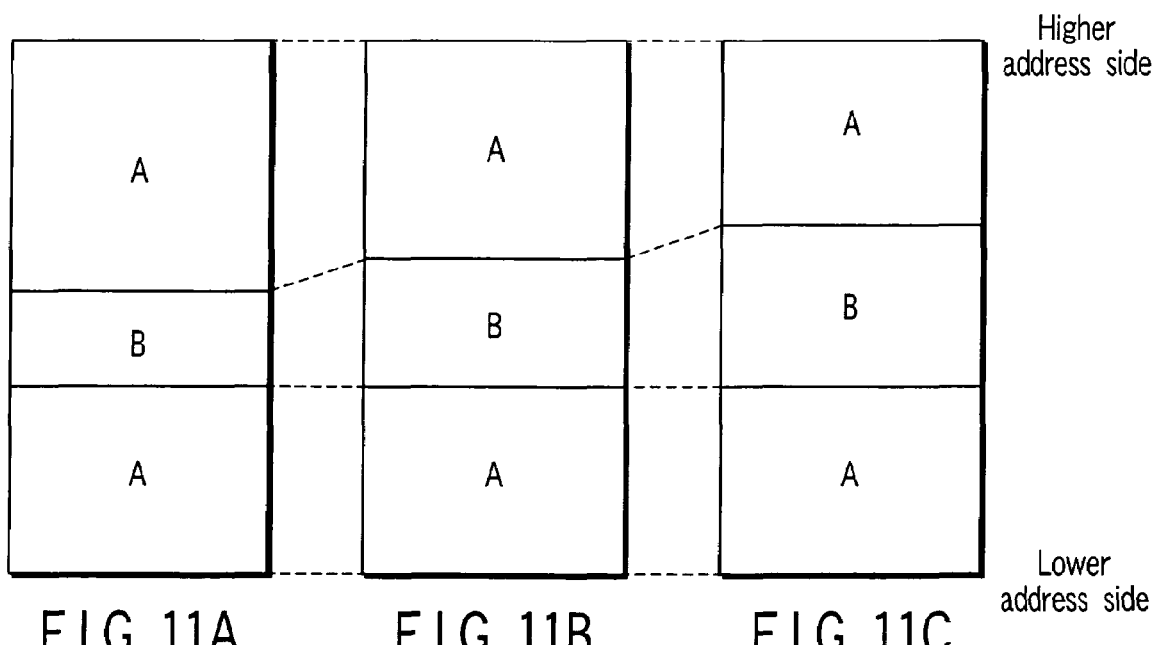
FIGS. 11A to 11C are views showing another example in the case where the size of the data storage area of the flash memory unit shown in FIG. 1 is changed.

FIGS. 11A to 11C show a case where the size of the data storage area B is changed by changing the higher address side of the data storage area B while fixing the lowest address of the data storage area B to a given intermediate address of the address space.

Figures 12A, 12B, 12C:
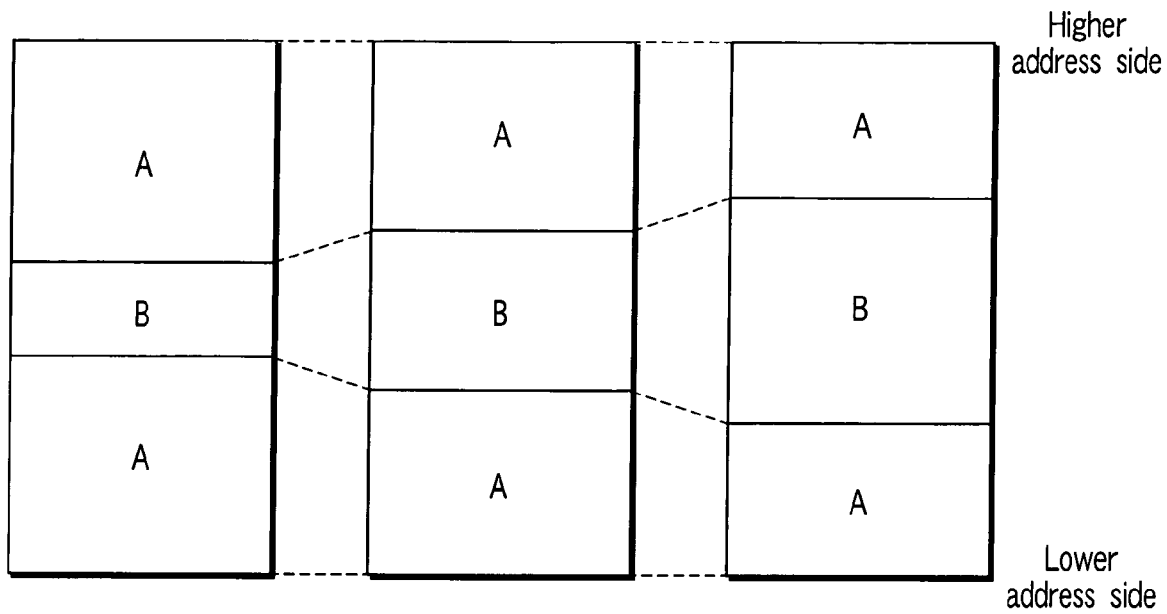
FIGS. 12A to 12C are views showing another example in the case where the size of the data storage area of the flash memory unit shown in FIG. 1 is changed.

FIGS. 12A to 12C show a case where the size of the data storage area B is changed by changing both the higher and lower address sides of the data storage area B while setting the highest and lowest addresses of the data storage area B to given intermediate addresses of the address space of the flash memory unit 11.

Figure 13:
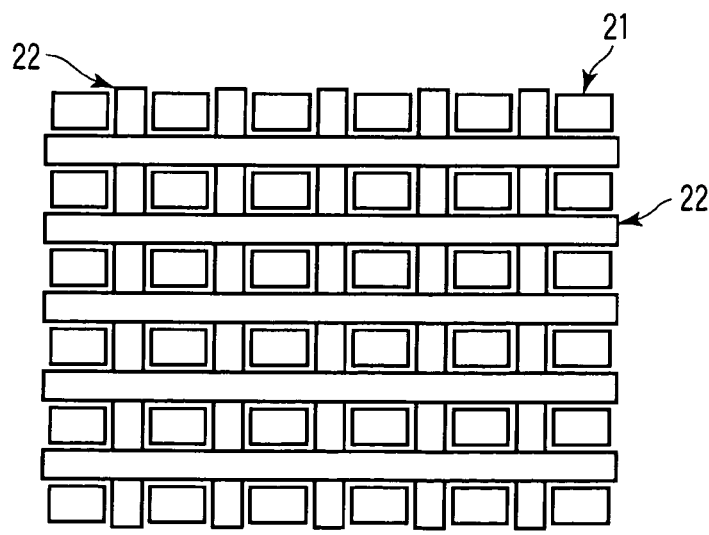
FIG. 13 is a block diagram showing a concrete configuration example of an FPGA unit which is a programmable logic device unit shown in FIG. 1.

FIG. 13 shows a concrete configuration example of the FPGA unit 12 shown in FIG. 1. The FPGA unit of this example includes a plurality of logical blocks 21 and a matrix-like wiring area 22.

When the program data stored in the data storage area B of the flash memory unit 11 is supplied to the FPGA unit having the configuration described above, a wiring matrix that connects between a large number of logical blocks 21 is established using the wiring area 22 to thereby constitute a circuit having a function corresponding to the supplied program data.

Figure 14:
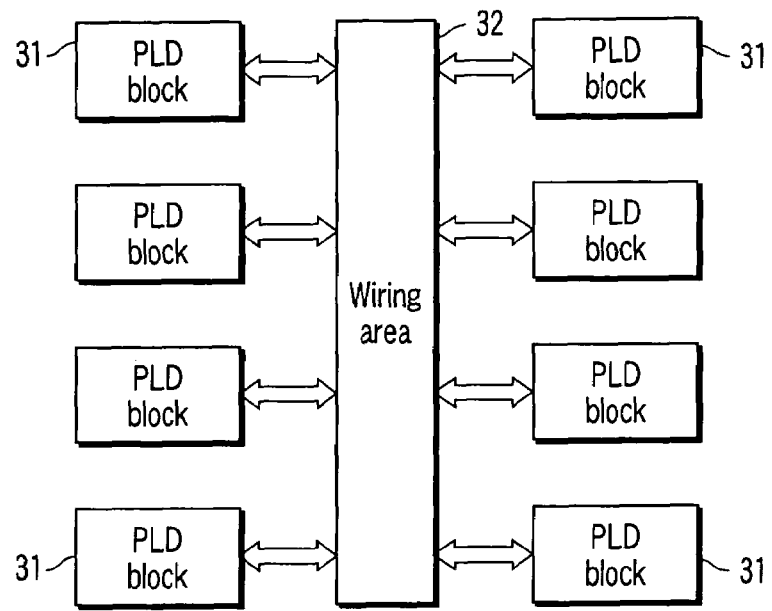
FIG. 14 is a block diagram showing a concrete example of a CPLD unit which is a programmable logic device unit shown in FIG. 1.

FIG. 14 shows an example of a CPLD unit used as the programmable logic device unit 12 shown in FIG. 1. The CPLD unit in this example includes a large number of PLD blocks 31 and a unit of wiring area 32 for connecting the PLD blocks 31. Each of the PLD blocks 31 is constituted by an AND-OR gate called macro cell, D-type flip-flop circuit, or the like.

When the program data stored in the data storage area B of the flash memory unit 11 is supplied to the CPLD unit having the configuration described above, a wiring that connects between a large number of PLD blocks 31 is established using the wiring area 32 to thereby constitute a circuit having a function corresponding to the supplied program data.

FIGS. 15A, 15B, and FIGS. 16A, 16B respectively show a part of configuration of the memory cell array in the non-volatile flash memory unit 11 shown in FIG. 1.

Figure 15A:
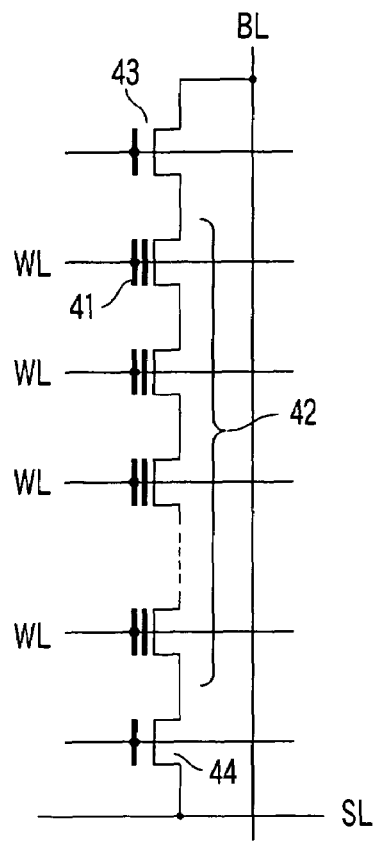
FIGS. 15A and 15B are circuit diagrams each showing a part of configuration of a memory cell array in the flash memory unit shown in FIG. 1.

FIG. 15A is a circuit configuration in the case where a NAND-type flash memory unit is used as the non-volatile memory unit 11. A non-volatile transistor having a two-layer gate electrode structure constituted by a control gate electrode and floating gate electrode is used as a unit cell 41, and a plurality of the unit cells 41 are connected in series to form a NAND array 42. The control gate electrode of each unit cell 41 is connected to each of a plurality of word lines WL. Each one end of the NAND array 42 is connected to a bit line BL through a first selection transistor 43; and each other end thereof is connected to a source line SL through a second selection transistor 44.

Figure 15B:
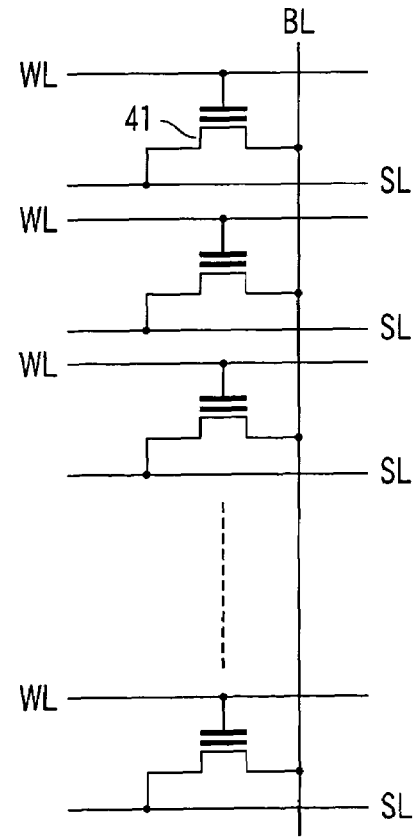

FIG. 15B is a circuit configuration in the case where a NOR-type flash memory unit is used as the non-volatile memory unit 11. A non-volatile transistor having a two-layer gate electrode structure constituted by a control gate electrode and floating gate electrode is used as a unit cell 41, and each of a plurality of the unit cells 41 are connected between a bit line BL and source line SL. The control gate electrode of each unit cell 41 is connected to each of a plurality of word lines WL.

FIG. 16A is a circuit configuration in the case where an MRAM unit having a MRAM cell is used as the non-volatile memory unit 11. Each of a plurality of MRAM cells 44 are connected in parallel between a bit line BL and a ground potential node. Each MRAM cell 44 is constituted by one magnetic tunnel junction (MTJ) device 45 and a read selection switch (transistor) 46. A word line WWL for data writing is provided in parallel to the each MTJ device 45. A word line RWL for data read is connected to the gate electrode of the read selection switch 46. The MTJ device 45 has a configuration in which a tunnel insulating film is sandwiched between a free layer and pin layer and stores data using a relationship between the magnetization direction of a ferromagnetic layer formed on the tunnel insulating film side of the free layer and magnetization direction of the pin layer.

FIG. 16B is a circuit configuration in the case where a ferroelectric random access memory (FeRAM) unit having an FeRAM cell is used as the non-volatile memory unit 11. A block selection switch (transistor) BST and a plurality of FeRAM cells 47 are connected in series between a bit line BL and plate line PL. A block selection line BS is connected to the gate electrode of the block selection switch BST. Each of the plurality of FeRAM cells 47 is constituted by a memory cell transistor 48 and a ferroelectric capacitor 49 connected between the source and drain of the memory cell transistor 48. The gate electrode of the memory cell transistor 48 is connected to a word line WL.

Although the FPGA unit 12 is so formed as to surround the flash memory unit 11 in the semiconductor integrated circuit device according to the above embodiment, the positional relationship between the flash memory unit 11 and FPGA unit 12 is not limited to this and the arrangement state thereof may be changed according the use.

Figure 17A:
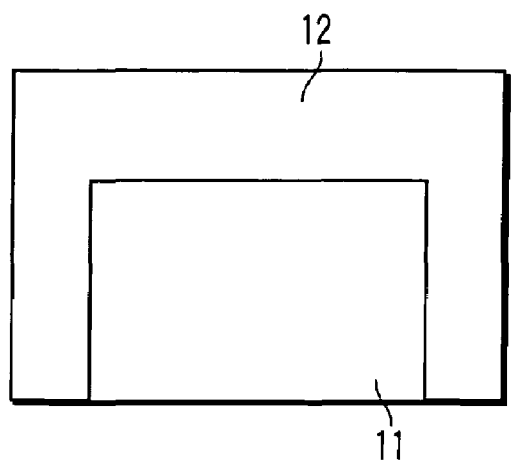
FIGS. 17A to 17C are plan views showing various arrangement states of the flash memory unit shown in FIG. 1 and FPGA unit.

FIG. 17A shows an arrangement state in which the FPGA unit 12 surrounds the three sides of the flash memory unit 11.

Figure 17B:
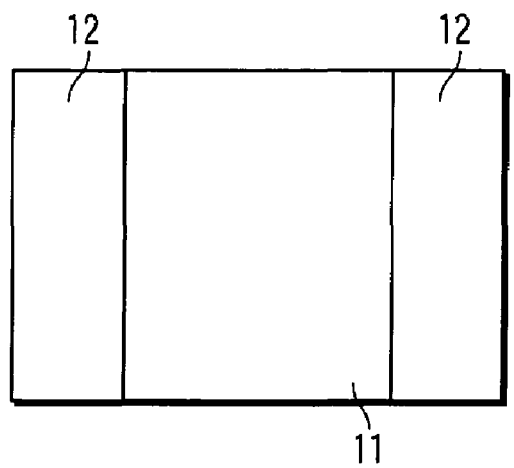

FIG. 17B shows an arrangement state in which the FPGA unit 12 is divided into two parts and the flash memory unit 11 is sandwiched between the two parts of the FPGA unit 12.

Figure 17C:
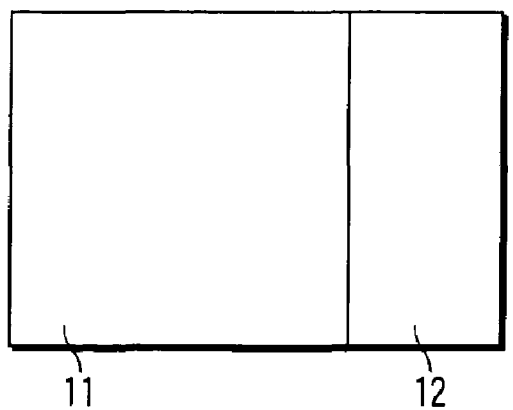

FIG. 17C shows an arrangement state in which the FPGA unit 12 and flash memory unit 11 are formed parallel to each other with only one sides thereof contacting each other.

Figure 18:
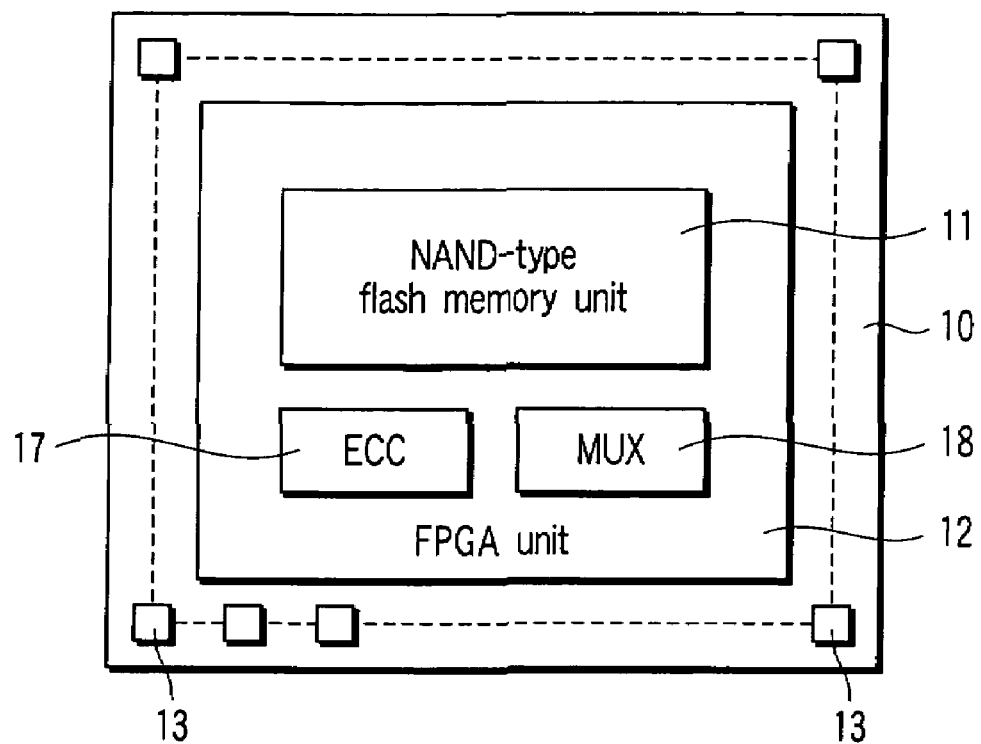
FIG. 18 is a plan view of a semiconductor chip of a semiconductor integrated circuit device according to a second embodiment of the present invention.

FIG. 18 is a plan view of a semiconductor chip of a semiconductor integrated circuit device according to a second embodiment of the present invention. The semiconductor chip 10 according to the second embodiment differs from that of the first embodiment shown in FIG. 1 in that an error checking and correcting (ECC) circuit 17 and multiplexer (MUX) 18 are integrally mounted on the semiconductor chip 10 in addition to the non-volatile memory unit 11 and programmable logic device unit 12.

Also in this semiconductor integrated circuit device according to the second embodiment, as the non-volatile memory unit 11, not only the NAND-type flash memory unit but also one of a NOR-type or AND-type flash memory unit, an MRAM unit having an MRAM cell, and an FeRAM unit having an FeRAM cell may be formed; and, as the programmable logic device unit 12, an FPGA unit, a CPLD unit having a CPLD structure, a DFA (TM), and other units having a PLD structure may be formed.

Figure 19:
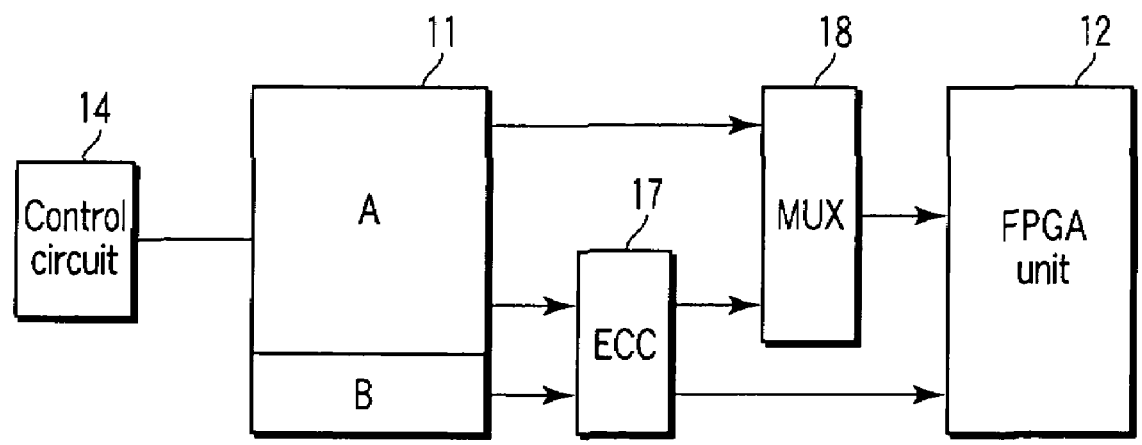
FIG. 19 is a view showing a circuit configuration example in the case where data is read from the data storage area of the flash memory unit shown in FIG. 18.

In the semiconductor integrated circuit device having the structure described above, program data for programming the FPGA unit 12 is previously stored in a data storage area B of the non-volatile memory unit 11. A data read operation from the data storage area B is performed as follows. For example, as shown in FIG. 19, a control circuit 14 controls operation of the non-volatile memory unit 11 at power-on time to allow the program data stored in the data storage area B to be read from the non-volatile memory unit 11. The program data thus read from the non-volatile memory unit 11 is subjected to error correction by the ECC circuit 17 and supplied to the FPGA unit 12. The FPGA unit 12 performs an operation called "Configuration" to form a circuit having a function corresponding to the program data. The circuit realized by using the FPGA unit 12 includes various interface circuits of the non-volatile memory unit 11, various types of control circuits, a clock generator, an arithmetic circuit, and the like.

On the other hand, ordinary data stored in the data storage area A of the non-volatile memory unit 11 is subjected to the error correction by the ECC circuit 17 as in the case of the data stored in the data storage area B and then supplied to the FPGA unit 12 through the multiplexer 18. Alternatively, the ordinary data may be supplied to the FPGA unit 12 through the multiplexer 18 without being subjected to error correction.

Also in the semiconductor integrated circuit device according to the second embodiment, the data for programming the FPGA unit 12 is stored in the non-volatile memory unit 11, so that the data is retained therein even when power is turned off and, when power is turned on again, the program data stored in the data storage area B of the non-volatile memory unit 11 is read and then supplied to the FPGA unit 12. That is, a circuit having the same function as before can be implemented by using the FPGA unit 12 every time power is turned on.

Further, as in the case of the first embodiment, simply by changing the program data to be stored in the data storage area B of the non-volatile memory unit 11, it is possible to allow the FPGA unit 12 to easily implement circuits having various functions after manufacturing of a semiconductor chip. As a result, a semiconductor integrated circuit device having high versatility can be realized. Further, since there is no need to make a mask for each product as in the case of the conventional technique, development cost can be reduced.

The programmable device provided in the non-volatile memory unit 11 is non-volatile type and a data writable one. Next, an example of a circuit configuration in the case where the program data is written to the non-volatile memory unit 11 will be described.

FIG. 20 shows a circuit configuration example in the case where the program data is written to the data storage area B of the non-volatile memory unit 11 provided in the semiconductor integrated circuit device of FIG. 18.

In this example, one external terminal 13 provided in the semiconductor chip is used. The program data is input serially to the external terminal 13 and then supplied to the flash memory unit 11 through an interface 15 and ECC circuit 17 provided in the non-volatile memory unit 11. The program data to which a code for correcting error data has been added is then sequentially written to the data storage area B.

As described above, at the data read time from the non-volatile memory unit 11, the data stored in the data storage area B of the non-volatile memory unit 11 is subjected to the error correction by the ECC circuit 17 and then supplied to the FPGA unit 12. The data stored in the data storage area A is supplied through the ECC circuit 17 for error correction or directly to the FPGA unit 12.

Figure 21:
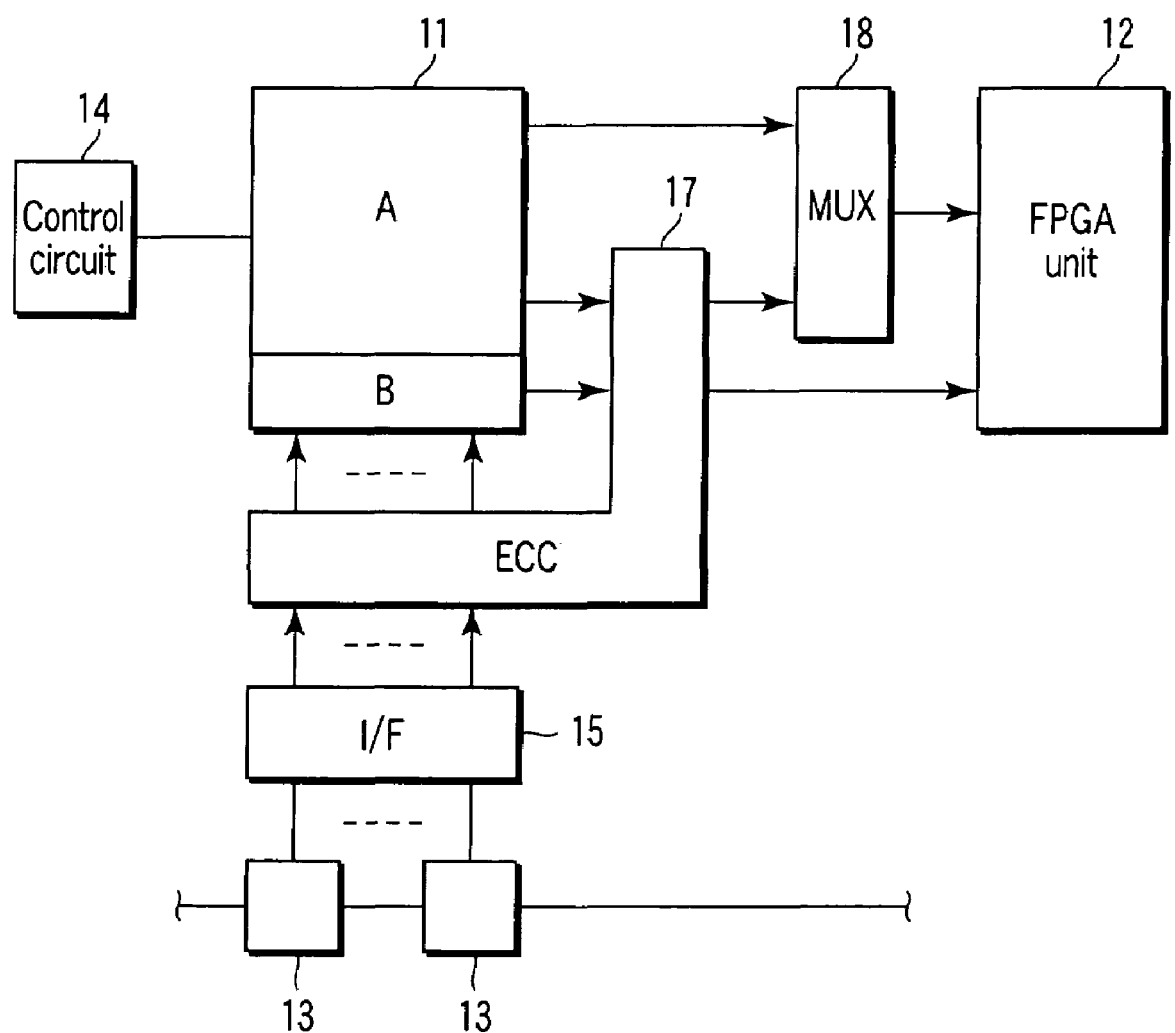
FIG. 21 is a view showing another circuit configuration example in the case where the program data is written to the data storage area of the flash memory unit shown in FIG. 18.

FIG. 21 shows another circuit configuration example in the case where the program data is written to the data storage area B of the non-volatile memory unit 11 provided in the semiconductor integrated circuit device of FIG. 18.

In this example, a plurality of external terminals 13 provided in the semiconductor chip are used. The program data is input in parallel to the external terminals 13 and then supplied to the flash memory unit 11 through the interface 15 and ECC circuit 17 provided in the non-volatile memory unit 11. The program data thus supplied is then written to the data storage area B. Either a parallel or serial data path may be used between the interface 15 and flash memory unit 11. The location of the data storage area B may be set depending on the type of the data supplied from the external terminal. The data stored in the data storage area A is supplied through the ECC circuit 17 for error correction or directly to the FPGA unit 12.

Figure 22:
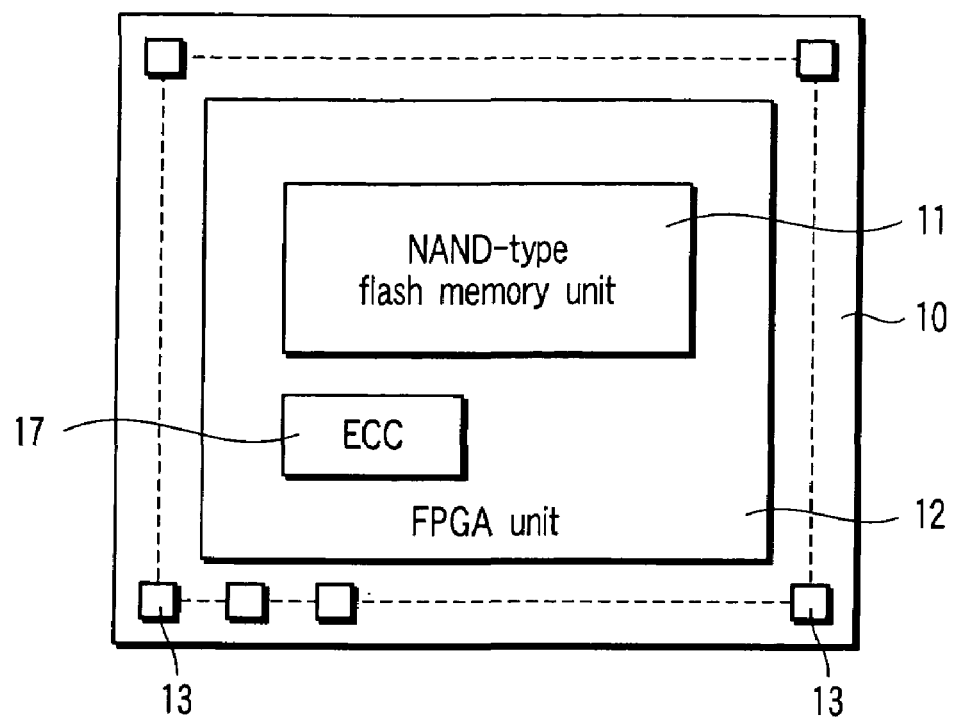
FIG. 22 is a plan view of a semiconductor chip of a semiconductor integrated circuit device according to a third embodiment of the present invention.

FIG. 22 is a plan view of a semiconductor chip of a semiconductor integrated circuit device according to a third embodiment of the present invention. The semiconductor chip 10 according to the third embodiment differs from that of the second embodiment shown in FIG. 18 in that the multiplexer 18 is omitted and an ECC circuit 17 is integrally mounted on the semiconductor chip 10 in addition to the non-volatile memory unit 11 and the FPGA unit 12.

Also in this semiconductor integrated circuit device according to the third embodiment, as the non-volatile memory unit 11, not only the NAND-type flash memory unit but also one of a NOR-type or AND-type flash memory unit, an MRAM unit having an MRAM cell, and an FeRAM unit having an FeRAM cell may be formed; and, as the programmable logic device unit 12, an FPGA unit, a CPLD unit having a CPLD structure, a DFA (TM), and other units having a PLD structure may be formed.

Also in the semiconductor integrated circuit device according to the third embodiment, the data for programming the FPGA unit 12 is stored in the non-volatile memory unit 11, so that the data is retained therein even when power is turned off and, when power is turned on again, the program data stored in the data storage area B of the non-volatile memory unit 11 is read and then supplied to the FPGA unit 12. That is, a circuit having the same function as before can be implemented by using the FPGA unit 12 every time power is turned on.

Figure 23:
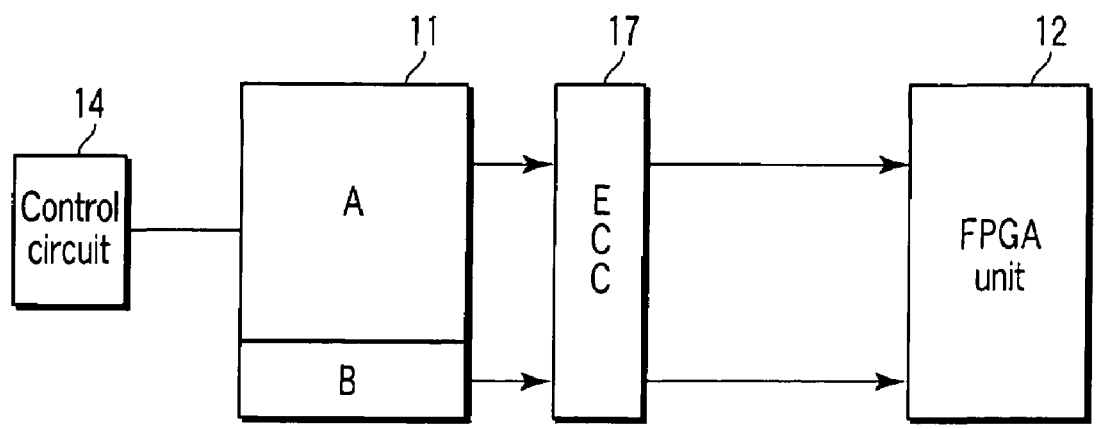
FIG. 23 is a view showing a circuit configuration example in the case where data is read from the data storage area of the flash memory unit shown in FIG. 22.

When data is read from the non-volatile memory unit 11 in the semiconductor integrated circuit device having the structure described above, the data is subjected to error correction by the ECC circuit 17 and then supplied to the FPGA unit 12, as shown in FIG. 23.

Figure 24:
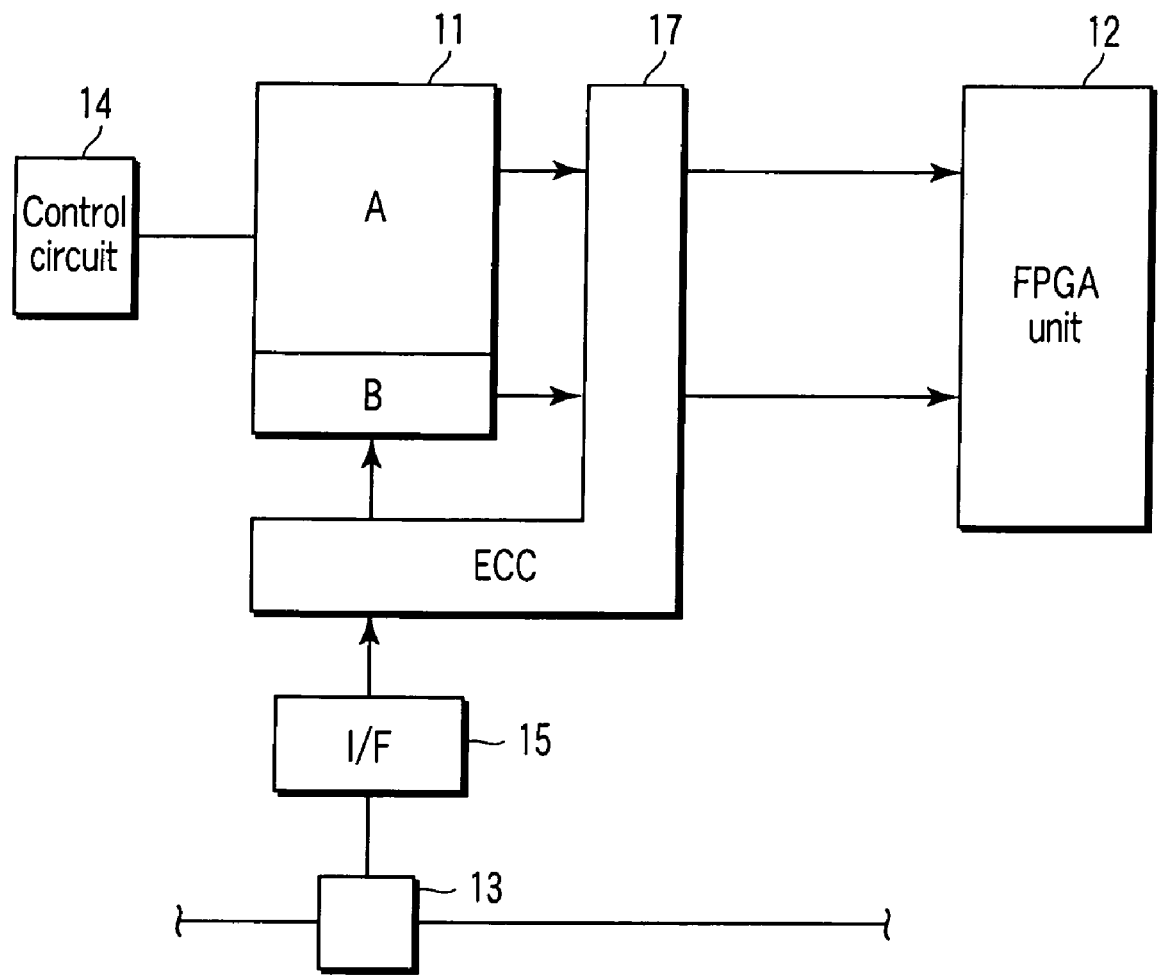
FIG. 24 is a view showing a circuit configuration example in the case where the program data is written to the data storage area of the flash memory unit shown in FIG. 22.

FIG. 24 shows a circuit configuration example in the case where the program data is written to the data storage area B of the non-volatile memory unit 11 provided in the semiconductor integrated circuit device shown in FIG. 22.

In this example, one external terminal 13 provided in the semiconductor chip is used. The program data is input serially to the external terminal 13 and then supplied to the flash memory unit 11 through an interface 15 and ECC circuit 17 provided in the non-volatile memory unit 11. The program data to which a code for correcting error data has been added is then sequentially written to the data storage area B.

As described above, at the data read time from the non-volatile memory unit 11, the data stored in the data storage area A or B of the non-volatile memory unit 11 is subjected to the error correction by the ECC circuit 17 and then supplied to the FPGA unit 12.

FIG. 25 shows another circuit configuration example in the case where the program data is written to the data storage area B of the non-volatile memory unit 11 provided in the semiconductor integrated circuit device 22.

In this example, a plurality of external terminals 13 provided in the semiconductor chip are used. The program data is input in parallel to the external terminals 13 and then supplied to the flash memory unit 11 through the interface 15 and ECC circuit 17 provided in the non-volatile memory unit 11. The program data thus supplied is then written to the data storage area B. Either a parallel or serial data path may be used between the interface 15 and flash memory unit 11. The location of the data storage area B may be set depending on the type of the data supplied from the external terminal.

FIGS. 26 to 56 show concrete configuration examples of various circuits realized by using the FPGA unit 12 of FIG. 1, FIG. 18, or FIG. 22. In particular, FIGS. 26 to 30 show concrete examples in which the FPGA unit 12 of FIG. 1, FIG. 18, or FIG. 22 is used to realize various circuits for allowing a NAND-type flash memory unit used as the non-volatile memory unit 11 to operate as a flash memory.

FIG. 26 is an example in which the FPGA unit 12 is used to realize an interface 60 having an interface circuit (NAND interface) 59 between the flash memory unit (NAND-type flash memory unit) 11 and a host 50. In this case, use of the FPGA allows the data transfer method, data transfer bus width, data transfer timing, and the like in the NAND interface 59 to be freely set depending on the chip configuration on the host side.

In FIG. 26, when an AND interface or NOR interface is realized in place of the NAND interface 59, the semiconductor chip can behave as if it includes an AND-type flash memory unit or NOR-type flash memory unit in spite of using the NAND-type flash memory unit.

Further, a configuration may be adopted in which a NOR-type flash memory unit is used as the non-volatile memory unit in place of the NAND-type flash memory unit and the FPGA unit 12 is used to realize a NOR interface. In this case, when a NAND interface or AND interface is realized in place of the NOR interface, the semiconductor chip can behave as if it includes an AND-type flash memory unit or NAND-type flash memory unit in spite of using the NOR-type flash memory unit.

Further, a configuration may be adopted in which an AND-type flash memory unit is used as the non-volatile memory unit in place of the NAND-type flash memory unit and the FPGA unit 12 is used to realize an AND interface. In this case, when a NAND interface or NOR interface is realized in place of the AND interface, the semiconductor chip can behave as if it includes a NAND-type flash memory unit or NOR-type flash memory unit in spite of using the AND-type flash memory unit.

Although one of the NAND-type, NOR-type, and AND-type flash memory units is used as the non-volatile memory unit 11 in the above description, two or more of them may be used as the non-volatile memory unit 11. In this case, an interface circuit may also be modified depending on the type of the non-volatile memory unit 11.

In the following description, a NAND-type flash memory unit is used as the non-volatile memory unit 11. However, as described with reference to FIG. 26, one or more of the above memory units can be freely selected as the non-volatile memory unit 11.

FIG. 27 is an example in which the FPGA unit 12 is used to realize the interface 60 having the NAND interface 59 and error correction circuit (ECC) 61.

Figure 28:
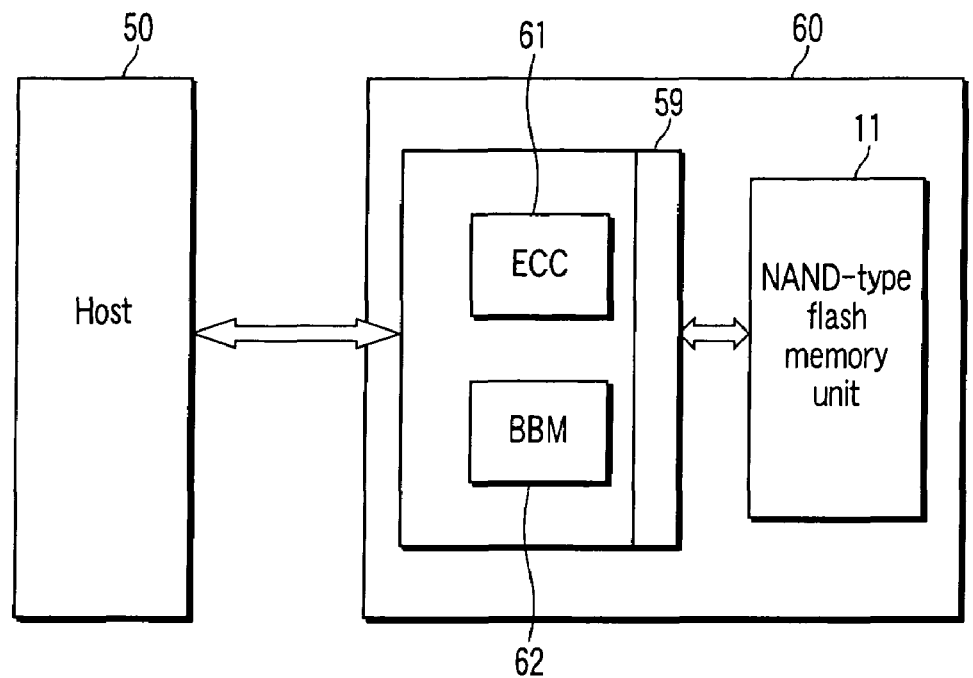
FIG. 28 is a block diagram showing a concrete example of a circuit realized by using the FPGA unit shown in FIG. 1, FIG. 8, or FIG. 22.

FIG. 28 is an example in which the FPGA unit 12 is used to realize the interface 60 having the NAND interface 59, error correction circuit (ECC) 61, and a bad block management (BBM) circuit 62. The BBM circuit is a circuit for detecting, correcting, and managing a faulty area of the memory cell array in the flash memory unit 11.

Figure 29:
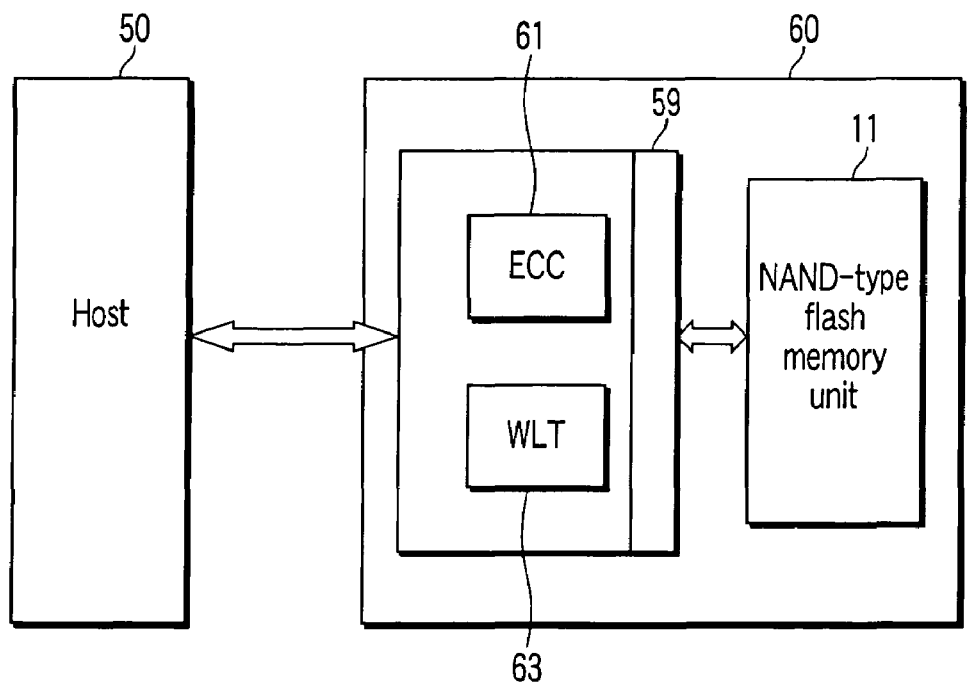
FIG. 29 is a block diagram showing a concrete example of a circuit realized by using the FPGA unit shown in FIG. 1, FIG. 8, or FIG. 22.

FIG. 29 is an example in which the FPGA unit 12 is used to realize the interface 60 having the NAND interface 59, ECC 61, and a wear leveling treatment (WLT) circuit 63. The WLT circuit is a circuit for unereasing the life of the memory cell in the flash memory unit 11.

Figure 30:
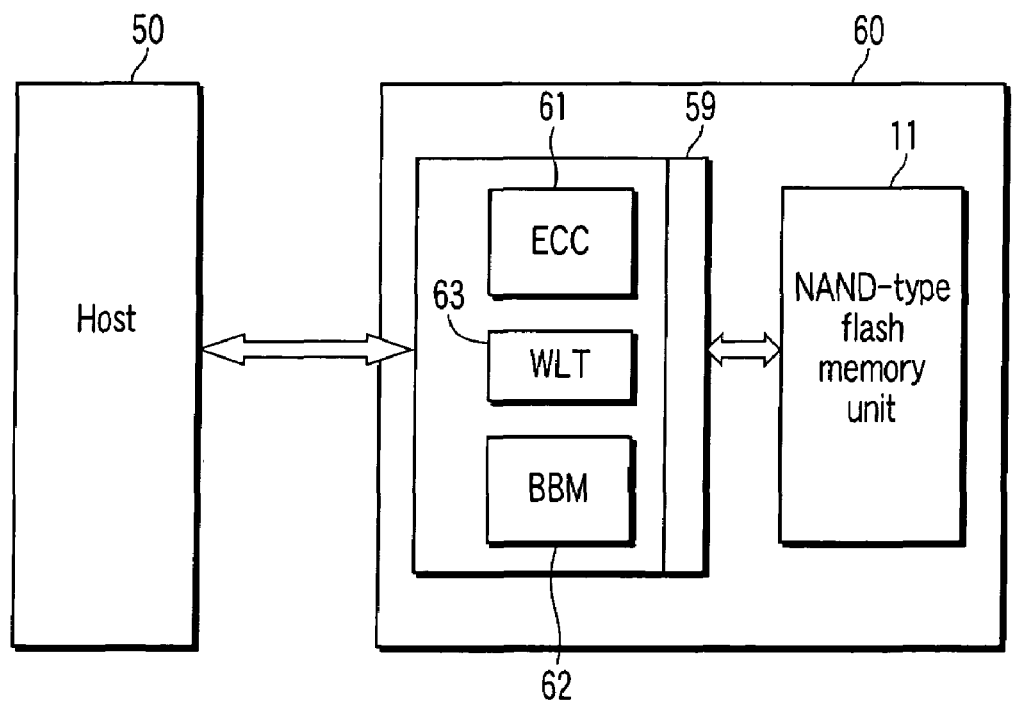
FIG. 30 is a block diagram showing a concrete example of a circuit realized by using the FPGA unit shown in FIG. 1, FIG. 8, or FIG. 22.

FIG. 30 is an example in which the FPGA unit 12 is used to realize the interface 60 having the NAND interface 59, ECC 61, BBM circuit 62, and WLT circuit 63.

In the circuits shown in FIG. 26 to FIG. 30, not only the NAND-type flash memory unit but also a NOR-type or AND-type flash memory unit, an MRAM unit, and an FeRAM unit may be formed as the non-volatile memory unit 11; and not only the FPGA unit but also a CPLD unit having a CPLD structure, a DFA unit, and other units having a PLD structure may be formed as the programmable logic device unit 12.

FIGS. 31 to 35 show concrete examples in which the FPGA unit 12 of FIG. 1 is used to realize various circuits for allowing a NAND-type flash memory unit used as the non-volatile memory unit 11 to operate as a register.

Figure 31:
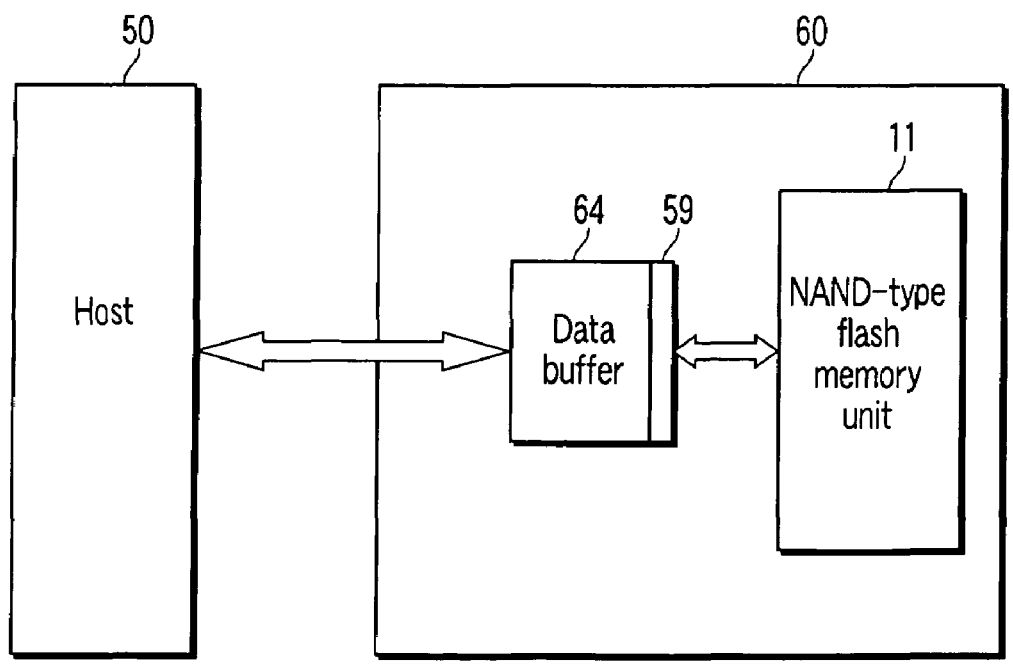
FIG. 31 is a block diagram showing a concrete example of a circuit realized by using the FPGA unit shown in FIG. 1, FIG. 8, or FIG. 22.

FIG. 31 is an example in which the FPGA unit 12 is used to realize the interface 60 having the NAND interface 59 and a data buffer (register) 64.

Figure 32:
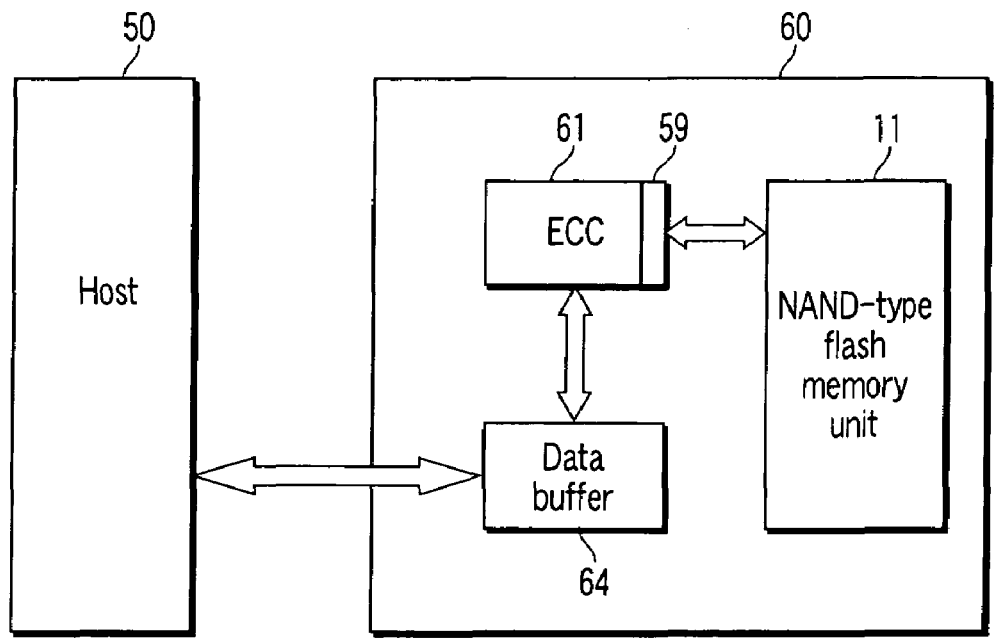
FIG. 32 is a block diagram showing a concrete example of a circuit realized by using the FPGA unit shown in FIG. 1, FIG. 8, or FIG. 22.

FIG. 32 is an example in which the FPGA unit 12 is used to realize the interface 60 having the NAND interface 59, data buffer 64, and ECC 61.

Figure 33:
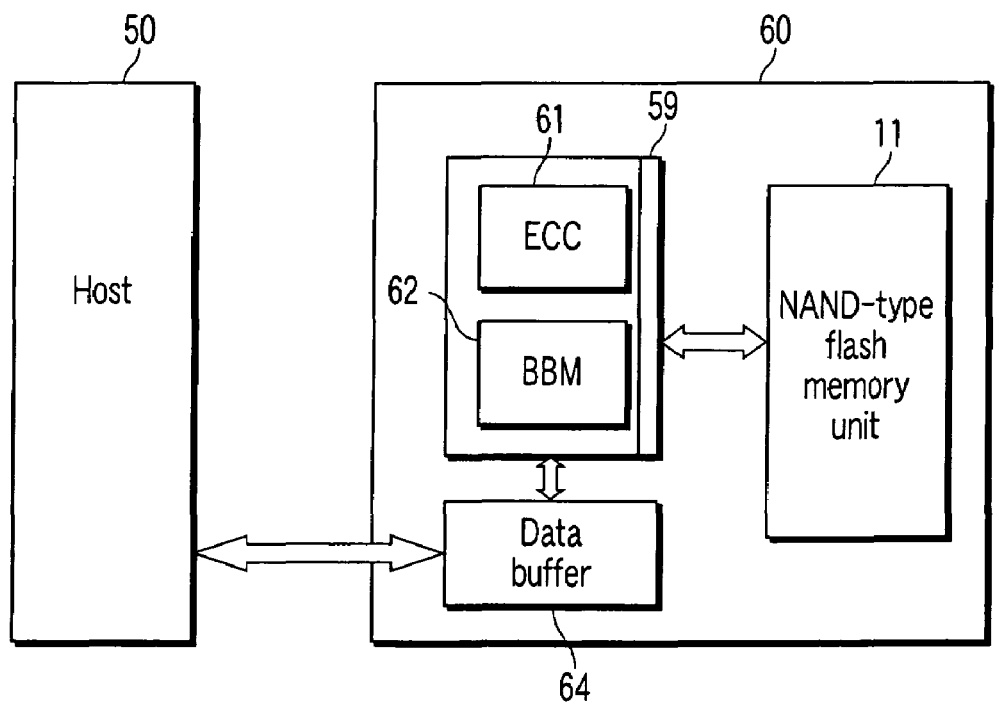
FIG. 33 is a block diagram showing a concrete example of a circuit realized by using the FPGA unit shown in FIG. 1, FIG. 8, or FIG. 22.

FIG. 33 is an example in which the FPGA unit 12 is used to realize the interface 60 having the NAND interface 59, data buffer 64, ECC 61, and BBM circuit 62.

FIG. 34 is an example in which the FPGA unit 12 is used to realize the interface 60 having the NAND interface 59, data buffer 64, and WLT circuit 63.

FIG. 35 is an example in which the FPGA unit 12 is used to realize the interface 60 having the NAND interface 59, data buffer 64, ECC 61, BBM circuit 62 and WLT circuit 63.

In the circuits shown in FIG. 31 to FIG. 35, not only the NAND-type flash memory unit but also a NOR-type or AND-type flash memory unit, an MRAM unit, and an FeRAM unit may be formed as the non-volatile memory unit 11; and not only the FPGA unit but also a CPLD unit having a CPLD structure, a DFA unit, and other units having a CPLD structure may be formed as the programmable logic device unit 12.

FIGS. 36 to 40 show concrete examples in which the FPGA unit 12 of FIG. 1, FIG. 18, or FIG. 22 is used to realize various circuits for allowing a NAND-type flash memory unit used as the non-volatile memory unit 11 to operate as a flash memory (NOR-type or AND-type), static random access memory (SRAM), or synchronous DRAM (SDRAM).

Figure 36:
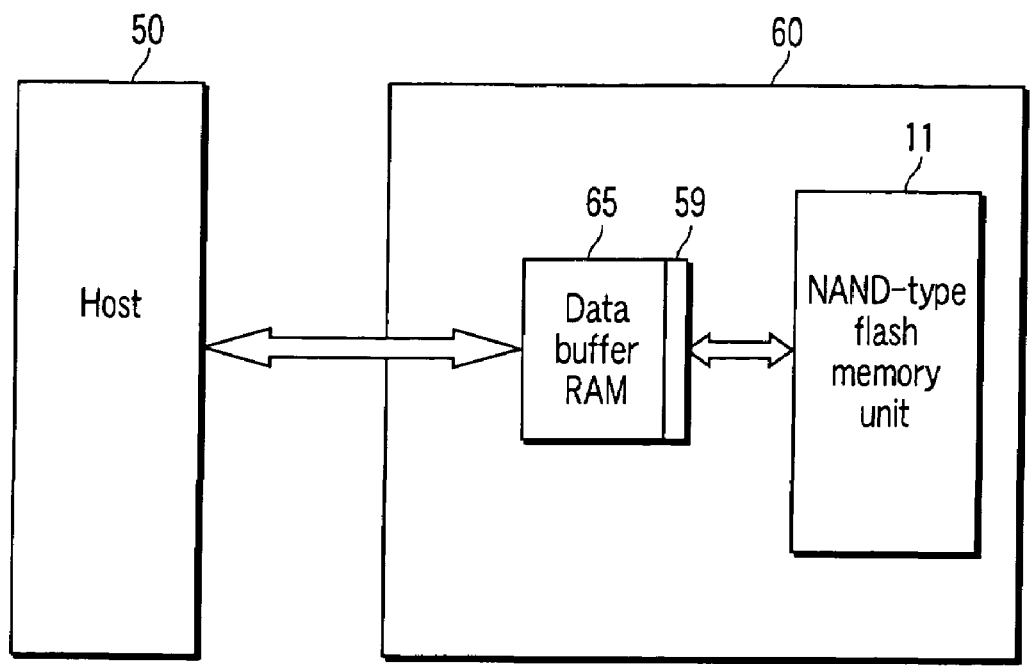
FIG. 36 is a block diagram showing a concrete example of a circuit realized by using the FPGA unit shown in FIG. 1, FIG. 8, or FIG. 22.

FIG. 36 is an example in which the FPGA unit 12 is used to realize the interface 60 having the NAND interface 59 and a data buffer RAM 65. The data buffer RAM is substantially an SRAM.

Figure 37:
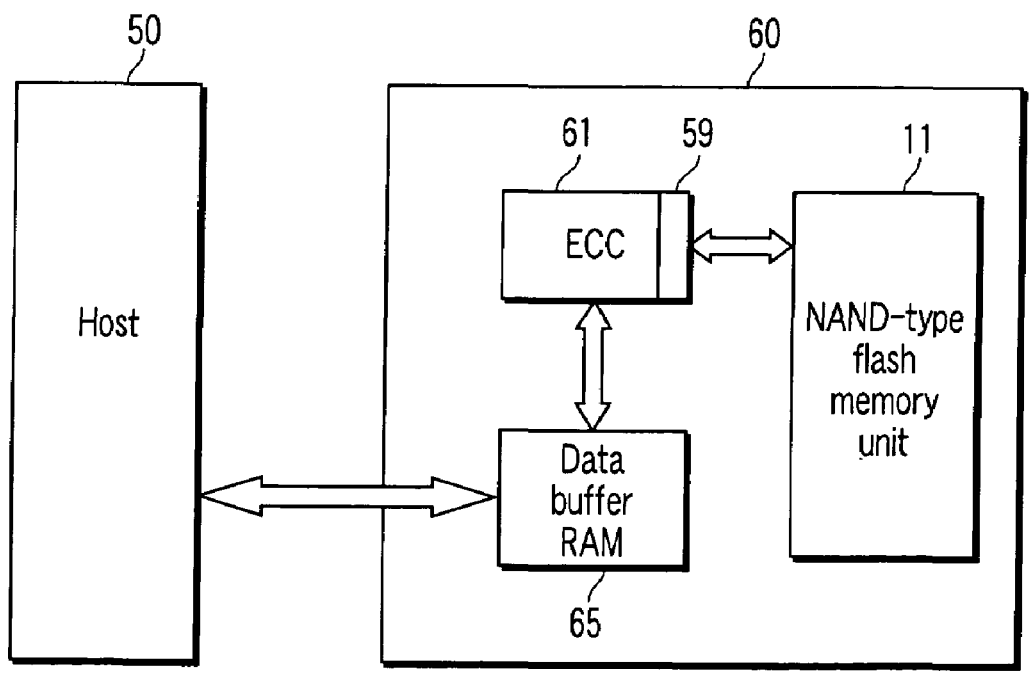
FIG. 37 is a block diagram showing a concrete example of a circuit realized by using the FPGA unit shown in FIG. 1, FIG. 8, or FIG. 22.

FIG. 37 is an example in which the FPGA unit 12 is used to realize the interface 60 having the NAND interface 59, data buffer RAM 65, and ECC 61. FIG. 38 is an example in which the FPGA unit 12 is used to realize the interface 60 having the NAND interface 59, data buffer RAM 65, ECC 61, and BBM circuit 62.

FIG. 39 is an example in which the FPGA unit 12 is used to realize the interface 60 having the NAND interface 59, data buffer RAM 65, ECC 61, and WLT circuit 63.

FIG. 40 is an example in which the FPGA unit 12 is used to realize the interface 60 having the NAND interface 59, data buffer RAM 65, ECC 61, BBM circuit 62, and WLT circuit 63.

By changing the configuration of the interface of the data buffer RAM 65, it is possible to allow the circuits of FIG. 36 to FIG. 40 to operate as a flash memory (NOR-type or AND-type), SRAM, or SDRAM.

In the circuits shown in FIG. 36 to FIG. 40, not only the NAND-type flash memory unit but also a NOR-type or AND-type flash memory unit, an MRAM unit, and an FeRAM unit may be formed as the non-volatile memory unit 11; and not only the FPGA unit but also a CPLD unit having a CPLD structure, a DFA unit, and other units having a CPLD structure may be formed as the programmable logic device unit 12.

FIGS. 41 to 44 show concrete examples in which the FPGA unit 12 of FIG. 1, FIG. 18, or FIG. 22 is used to realize various circuits for allowing a NAND-type flash memory unit used as the non-volatile memory unit 11 to operate as two circuits: one is a register and the other is a flash memory.

FIG. 41 is an example in which the FPGA unit 12 is used to realize the interface 60 having the NAND interface 59, data buffer 64, and ECC 61.

FIG. 42 is an example in which the FPGA unit 12 is used to realize the interface 60 having the NAND interface 59, data buffer 64, ECC 61, and BBM circuit 62.

FIG. 43 is an example in which the FPGA unit 12 is used to realize the interface 60 having the NAND interface 59, data buffer 64, ECC 61, and WLT circuit 63.

Figure 44:
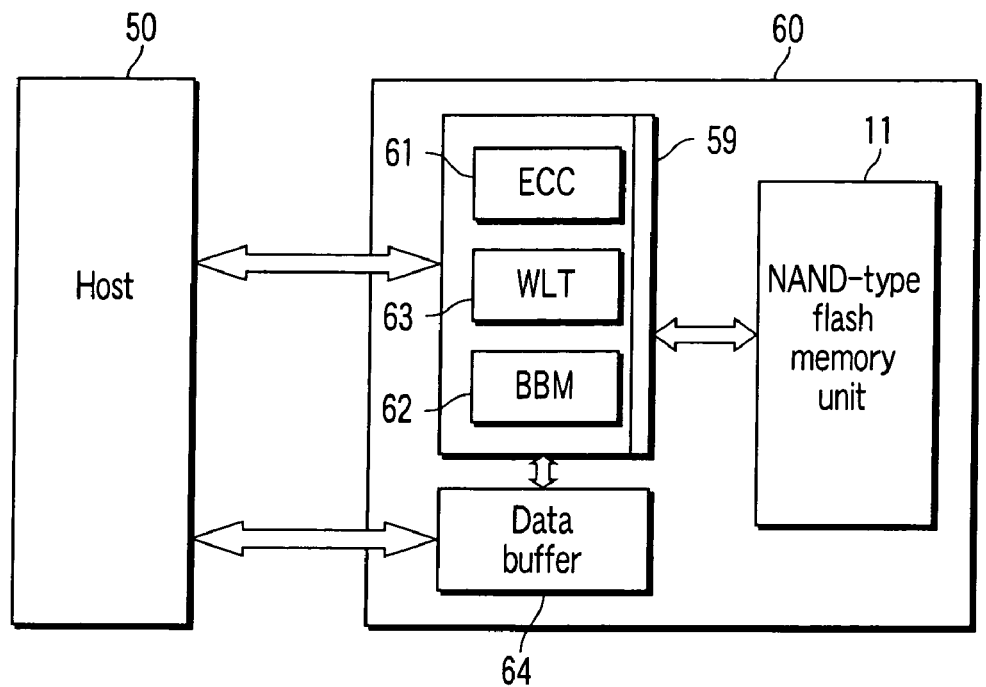
FIG. 44 is a block diagram showing a concrete example of a circuit realized by using the FPGA unit shown in FIG. 1, FIG. 8, or FIG. 22.

FIG. 44 is an example in which the FPGA unit 12 is used to realize the interface 60 having the NAND interface 59, data buffer 64, ECC 61, BBM circuit 62, and WLT circuit 63.

In the circuits shown in FIG. 41 to FIG. 44, not only the NAND-type flash memory unit but also a NOR-type or AND-type flash memory unit, an MRAM unit, and an FeRAM unit may be formed as the non-volatile memory unit 11; and not only the FPGA unit but also a CPLD unit having a CPLD structure, a DFA unit, and other units having a CPLD structure may be formed as the programmable logic device unit 12.

Although two data paths are provided between the host 50 and interface 60 in the circuits shown in FIGS. 41 to 44, the number of data paths may be reduced to one. In this case, one data path is used in a time-sharing mode between two circuits.

FIGS. 45 to 48 show concrete examples in which the FPGA unit 12 of FIG. 1, FIG. 18, or FIG. 22 is used to realize various circuits for allowing a NAND-type flash memory unit used as the non-volatile memory unit 11 to operate as two circuits: one is a flash memory (NOR-type or AND-type), SRAM, or SDRAM, and the other is a flash memory (NAND-type).

Figure 45:
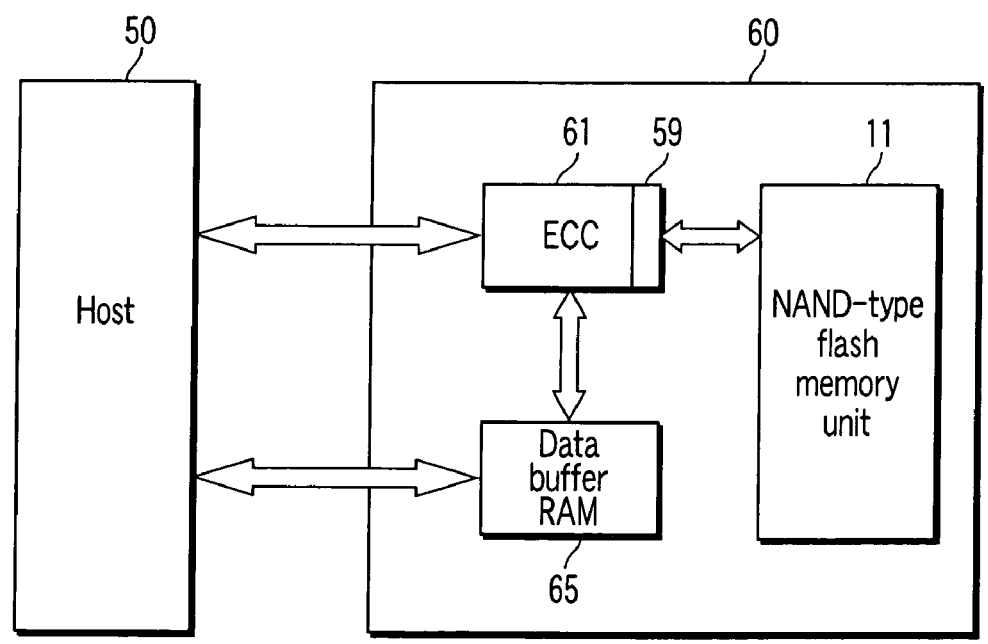
FIG. 45 is a block diagram showing a concrete example of a circuit realized by using the FPGA unit shown in FIG. 1, FIG. 8, or FIG. 22.

FIG. 45 is an example in which the FPGA unit 12 is used to realize the interface 60 having the NAND interface 59, data buffer RAM 65, and ECC 61.

Figure 46:
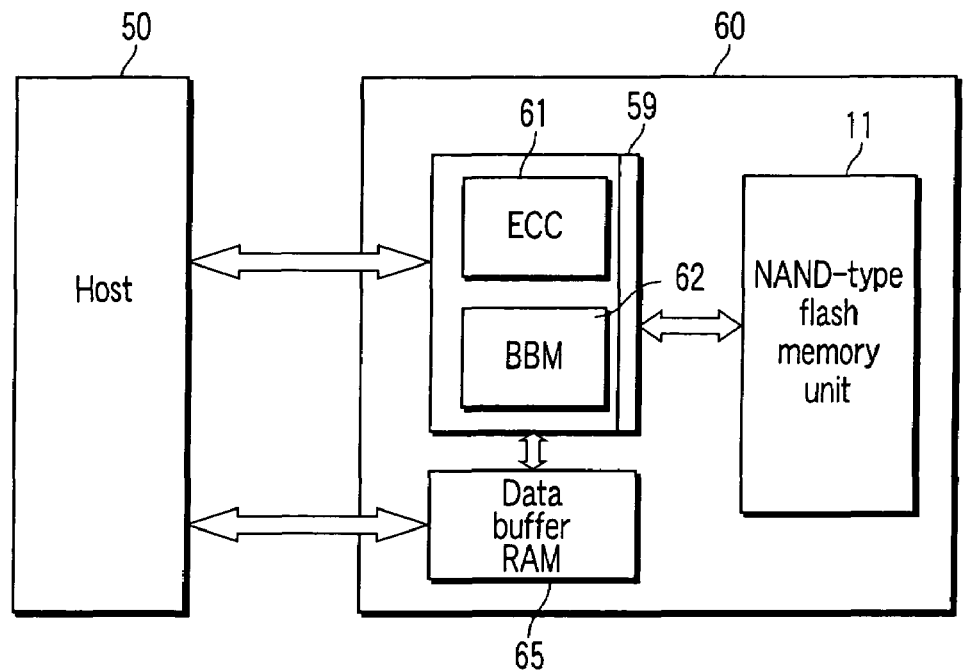
FIG. 46 is a block diagram showing a concrete example of a circuit realized by using the FPGA unit shown in FIG. 1, FIG. 8, or FIG. 22.

FIG. 46 is an example in which the FPGA unit 12 is used to realize the interface 60 having the NAND interface 59, data buffer RAM 65, ECC 61, and BBM circuit 62.

Figure 47:
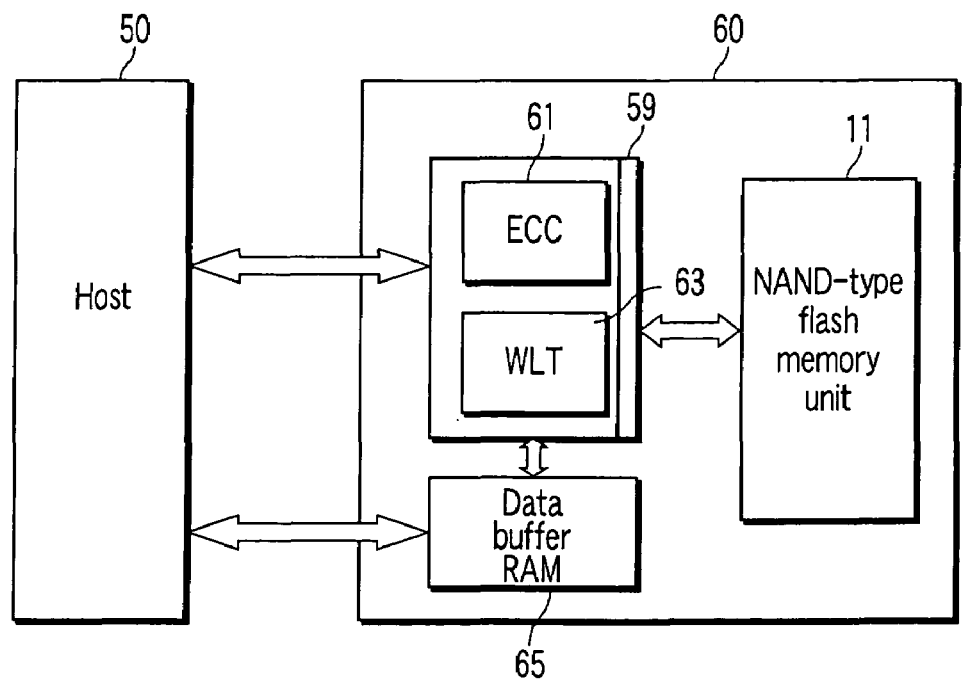
FIG. 47 is a block diagram showing a concrete example of a circuit realized by using the FPGA unit shown in FIG. 1, FIG. 8, or FIG. 22.

FIG. 47 is an example in which the FPGA unit 12 is used to realize the interface 60 having the NAND interface 59, data buffer RAM 65, ECC 61, and WLT circuit 63.

Figure 48:
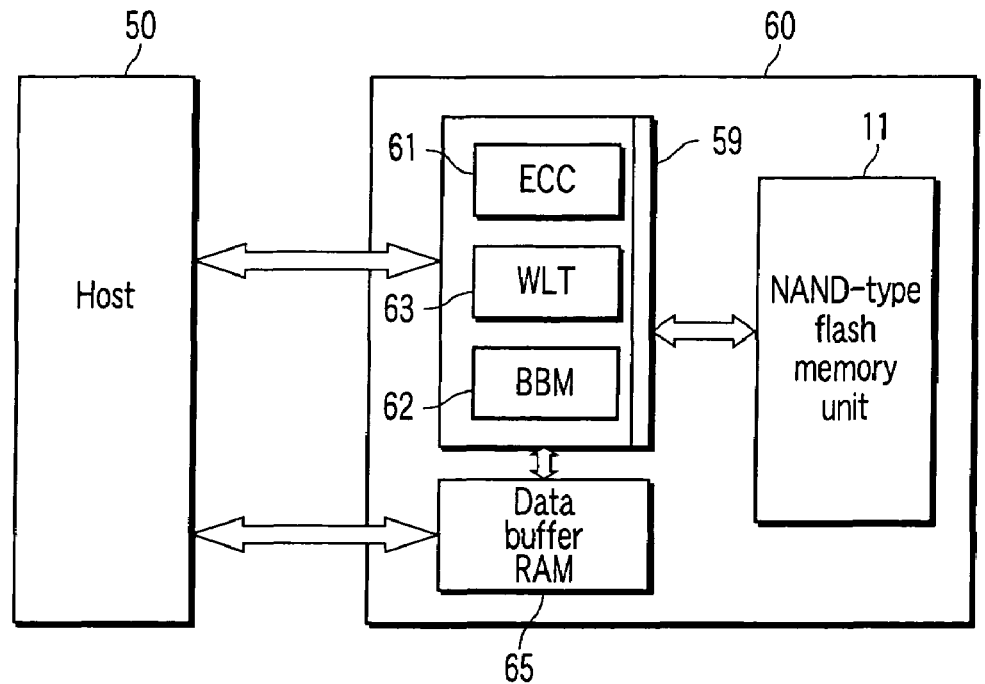
FIG. 48 is a block diagram showing a concrete example of a circuit realized by using the FPGA unit shown in FIG. 1, FIG. 8, or FIG. 22.

FIG. 48 is an example in which the FPGA unit 12 is used to realize the interface 60 having the NAND interface 59, data buffer RAM 65, ECC 61, BBM circuit 62, and WLT circuit 63.

By changing the configuration of the interface of the data buffer RAM 65, it is possible to allow the circuits of FIG. 45 to FIG. 48 to operate as an SRAM or SDRAM.

In the circuits shown in FIG. 45 to FIG. 48, not only the NAND-type flash memory unit but also a NOR-type or AND-type flash memory unit, an MRAM unit, and an FeRAM unit may be formed as the non-volatile memory unit 11; and not only the FPGA unit but also a CPLD unit having a CPLD structure, a DFA unit, and other units having a CPLD structure may be formed as the programmable logic device unit 12.

Although two data paths are provided between the host 50 and interface 60 in the circuits shown in FIGS. 45 to 48, the number of data paths may be reduced to one. In this case, one data path is used in a time-sharing mode between two circuits.

In the above description, the non-volatile memory unit 11 and FPGA unit 12 are used to realize a semiconductor integrated circuit device having one or two functions. Alternatively, however, a semiconductor integrated circuit device having three or more functions may be realized. In this case, data transfer may be performed in a time-sharing mode using a single data path.

Figure 49:
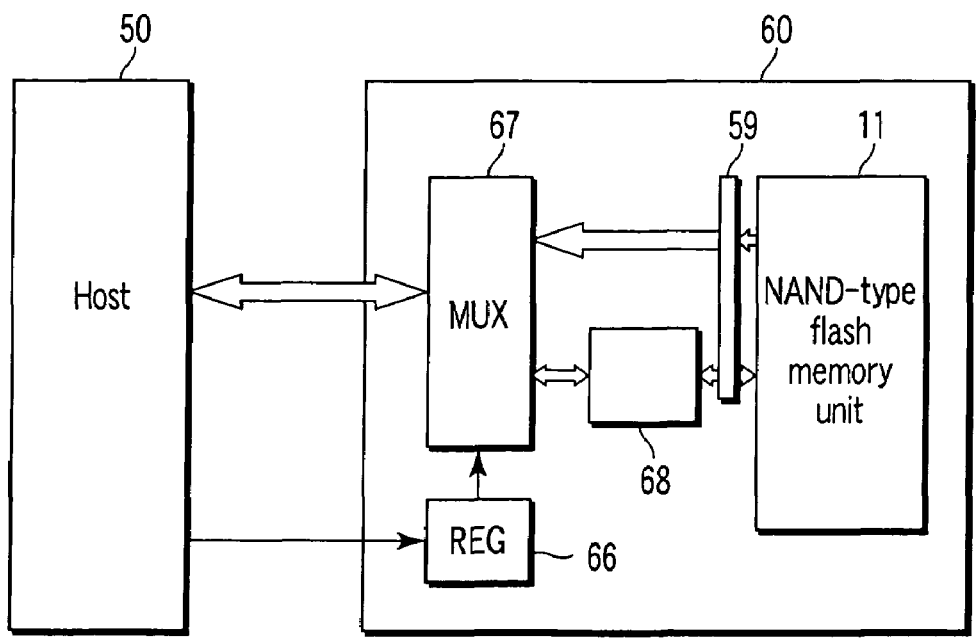
FIG. 49 is a block diagram showing a concrete example of a circuit realized by using the FPGA unit shown in FIG. 1, FIG. 8, or FIG. 22.

FIG. 49 shows a configuration example in which the FPGA unit 12 of FIG. 1, FIG. 18, or FIG. 22 is used to realize a circuit for allowing a NAND-type flash memory unit used as the non-volatile memory unit 11 to operate as a boot ROM at first and allowing the NAND-type flash memory to function as a flash memory or SRAM after data has been written to a baseband chip.

As shown in FIG. 49, the FPGA unit 12 is used to realize the interface 60 having the NAND interface 59, a flag register (REG) 66, a switching circuit (MUX) 67, and a circuit 68 including at least one of the abovementioned components: ECC 61, BBM circuit 62, WLT circuit 63, data buffer 64, and data buffer RAM 65.

In the configuration described above, in the first stage, the switching circuit 67 selects the boot area of the NAND-type flash memory unit to allow the NAND-type flash memory unit to operate as a boot ROM.

After data has been written to a baseband chip, the flag register 66 sets a flag from the host 50. Then, the switching circuit 67 selects an output from the circuit 68 based on the output from the flag register 66. At this time, the NAND-type flash memory unit operates as a flash memory or SRAM depending on the configuration of the circuit 68. In this case, it is possible to constitute a semiconductor integrated circuit device having two or more functions by using the NAND-type flash memory unit and FPGA unit 12. Further, in this case, a configuration may be adopted in which one data path is used in a time-sharing mode between two or more circuits.

The use of the FPGA unit 12 allows various interface circuits of the non-volatile memory unit or various control circuits such as a clock generator or arithmetic circuit to be realized in addition to the abovementioned circuits. Further, it is possible to realize a processor (DSP, CPU, and the like) for many purposes.

Although in the circuit shown in FIG. 26, the FPGA unit 12 is used to realize the interface 60 having an interface circuit (NAND interface) 59 between the flash memory unit (NAND-type flash memory unit) 11 and a host 50, another configuration as shown in FIG. 50 may be adopted in which the FPGA unit 12 is used to realize the interface 60 having the NAND interface 59 and a NOR interface 69 to allow the NAND-type flash memory unit to operate both as a NAND-type flash memory and NOR-type flash memory.

Further, as shown in FIG. 51, it is possible to realize the interface 60 having the NAND interface 59 and an SRAM interface 70 using the FPGA unit 12 to allow the NAND-type flash memory unit to operate both as a NAND-type flash memory and SRAM.

Further, as shown in FIG. 52, it is possible to realize the interface 60 having the NAND interface 59 and data buffer 64 using the FPGA unit 12.

Figure 53:
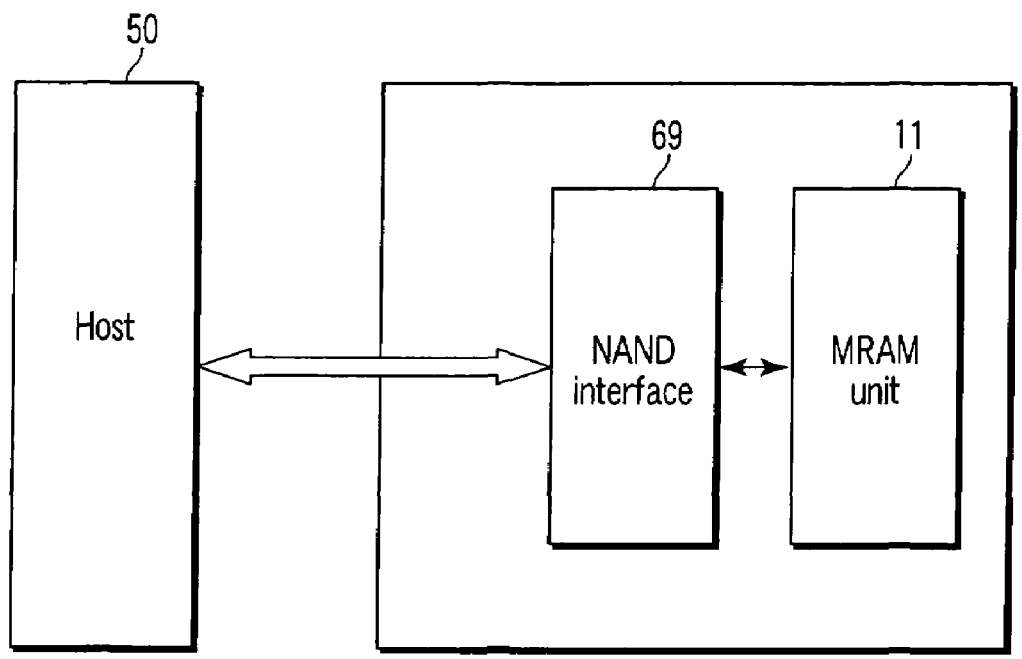
FIG. 53 is a block diagram showing a concrete example of a circuit realized by using the FPGA unit shown in FIG. 1, FIG. 8, or FIG. 22.

FIG. 53 is a configuration example in which the FPGA unit 12 of FIG. 1, FIG. 18 or FIG. 22 is used to realize a NAND interface 69 for allowing an MRAM unit used as the non-volatile memory unit 11 to operate as a NAND-type flash memory unit.

In FIG. 53, it is possible to realize a NOR interface and AND interface by using the FPGA unit 12 in place of the NAND interface 69 to allow the MRAM unit to operate both as a NOR-type flash memory unit and AND-type flash memory unit. Further, it is possible to realize an MRAM interface by using the FPGA unit 12 to allow the MRAM unit to operate as an MRAM unit.

Figure 54:
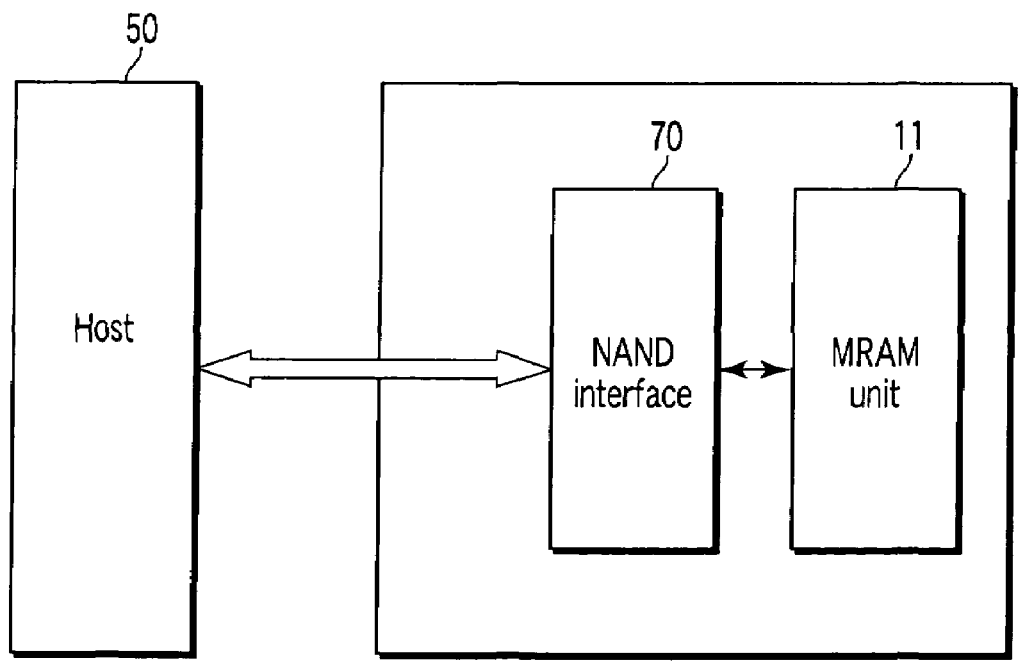
FIG. 54 is a block diagram showing a concrete example of a circuit realized by using the FPGA unit shown in FIG. 1, FIG. 8, or FIG. 22.

FIG. 54 is a configuration example in which the FPGA unit 12 of FIG. 1, FIG. 18 or FIG. 22 is used to realize a NAND interface 70 for allowing an FeRAM unit used as the non-volatile memory unit 11 to operate as a NAND-type flash memory unit.

In FIG. 54, it is possible to realize a NOR interface and AND interface by using the FPGA unit 12 in place of the NAND interface 70 to allow the FeRAM unit to operate both as a NOR-type flash memory unit and AND-type flash memory unit. Further, it is possible to realize an MRAM interface by using the FPGA unit 12 to allow the FeRAM unit to operate as an MRAM unit.

As described above, the non-volatile memory unit 11 formed on a semiconductor chip is not limited to a single memory unit (e.g., NAND-type flash memory unit). For example, as shown in FIG. 55, a NAND-type flash memory unit 11a and MRAM unit 11b, i.e., two memory units, may be formed as the non-volatile memory unit 11. In the circuit shown in FIG. 55, the FPGA unit 12 is used to realize the NAND interface 59 and an MRAM interface 71. Further, as shown in FIG. 56, three memory units including the NAND-type flash memory unit 11a, MRAM unit 11b, and an FeRAM unit 11c may be formed as the non-volatile memory unit 11. In the circuit shown in FIG. 56, the FPGA unit 12 is used to realize the NAND interface 59, MRAM interface 71, and an FeRAM interface 72. Further, three or more non-volatile memory units are formed as the non-volatile memory unit 11.

Although in FIGS. 55 and 56, the NAND interface 59 is connected to the NAND-type flash memory unit 11a, MRAM interface 71 is connected to the MRAM unit 11b, and FeRAM interface 72 is connected to the FeRAM unit 11c, a different type interface may be connected to the non-volatile memory unit. For example, the MRAM interface 71 or FeRAM interface 72 may be connected to the NAND-type flash memory unit 11a, NAND 59 or FeRAM interface 72 may be connected to the MRAM unit 11b, and NAND interface 59 or MRAM interface 71 may be connected to the FeRAM interface 72.

The configuration of the interface is not limited to the examples described above and various modifications may be made.

Further, in the case where two or more types of memory units are formed as the non-volatile unit, the FPGA unit 12 may be controlled by a single memory unit or by two or more memory units. That is, by storing program data for controlling the FPGA unit 12 in one or more memory units, it is possible to constitute a NAND interface, MRAM interface, or FeRAM interface.

In the examples shown in FIGS. 26 to 56, the configuration of the interface side may be modified in accordance with the specification of the host 50 and configuration of the host 50 may be modified in accordance with the specification of the interface side.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device, comprising:
    a programmable logic device unit provided on a semiconductor chip;
    a non-volatile memory unit provided on the semiconductor chip and configured to store data for programming the programmable logic device unit in a part of a data storage area thereof;
    a control circuit configured to control the non-volatile memory unit to readout the data stored in the part of the data storage area at power-on time and supplied to the programmable logic device unit and configured to change a function of the programmable logic device unit based on the data; and
    an error correction circuit which is provided on the semiconductor chip and connected to the programmable logic device unit,
    wherein the programmable logic device unit is programmed to form a first interface circuit, with the first interface circuit having a NAND interface and a data buffer, and
    wherein the error correction circuit is configured to perform error correction of data for programming the programmable logic device unit.

2. The device according to claim 1, wherein the non-volatile memory unit is at least one of a NAND-type, NOR-type, or AND-type flash memory unit, an MRAM unit having an MRAM cell, and an FeRAM unit having an FeRAM cell.

3. The device according to claim 1, wherein the programmable logic device unit has an FPGA or CPLD structure.

4. The device according to claim 1, wherein the data for programming the programmable logic device unit is input to the non-volatile memory unit through at least one external terminal provided on the semiconductor chip.

5. The device according to claim 1, further comprising:
    a host which exchanges data with the non-volatile memory unit through the first interface circuit formed using the programmable logic device unit,
    wherein the host includes:
        a second interface circuit, and
        a configuration of the first interface circuit is modified in accordance with a specification of the host or a configuration of the second interface circuit is modified in accordance with a specification of the first interface circuit.

* * * * *